(12) United States Patent
Stoessel et al.

(10) Patent No.: US 11,404,649 B2
(45) Date of Patent: Aug. 2, 2022

(54) ELECTROLUMINESCENT BRIDGED METAL COMPLEXES FOR USE IN ELECTRONIC DEVICES

(71) Applicant: Merck Patent GmbH, Darmstadt (DE)

(72) Inventors: Philipp Stoessel, Frankfurt am Main (DE); Christian Ehrenreich, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 559 days.

(21) Appl. No.: 15/748,472

(22) PCT Filed: Jul. 4, 2016

(86) PCT No.: PCT/EP2016/001143
§ 371 (c)(1),
(2) Date: Jan. 29, 2018

(87) PCT Pub. No.: WO2017/016634
PCT Pub. Date: Feb. 2, 2017

(65) Prior Publication Data
US 2018/0226591 A1    Aug. 9, 2018

(30) Foreign Application Priority Data

Jul. 30, 2015    (EP) ..................... 15178985

(51) Int. Cl.
| | | |
|---|---|---|
| *H01L 51/00* | (2006.01) | |
| *C07F 15/00* | (2006.01) | |
| *C09K 11/06* | (2006.01) | |
| *H01L 51/50* | (2006.01) | |

(52) U.S. Cl.
CPC ...... *H01L 51/0085* (2013.01); *C07F 15/0033* (2013.01); *C07F 15/0086* (2013.01); *C09K 11/06* (2013.01); *H01L 51/0087* (2013.01); *C09K 2211/1029* (2013.01); *C09K 2211/1033* (2013.01); *C09K 2211/1044* (2013.01); *C09K 2211/1059* (2013.01); *C09K 2211/185* (2013.01); *H01L 51/5016* (2013.01)

(58) Field of Classification Search
CPC ............ C07F 15/002; C07F 15/0033; C07F 15/0046; C07F 15/006; C07F 15/0073; C07F 15/0086; C09K 11/06; C09K 2211/185; C09K 2211/1029; C09K 2211/1033; C09K 2211/1044; C09K 2211/1048; C09K 2211/1059; C09K 2211/1062; C09K 2211/1074; C09K 2211/1077; H01L 51/0084; H01L 51/0085; H01L 51/0086; H01L 51/0087; H01L 51/0088; H01L 51/5016

See application file for complete search history.

(56) References Cited

U.S. PATENT DOCUMENTS

| | | | | |
|---|---|---|---|---|
| 2007/0281182 | A1* | 12/2007 | Schulte ............... | H01L 51/0085 428/690 |
| 2012/0075171 | A1* | 3/2012 | Hashimoto .......... | C07D 409/14 345/80 |
| 2014/0045810 | A1* | 2/2014 | Pan ..................... | H01L 51/0085 514/185 |
| 2015/0270500 | A1* | 9/2015 | Stoessel ............... | C07F 15/0033 252/301.35 |
| 2015/0349277 | A1 | 12/2015 | Stoessel et al. | |
| 2018/0026209 | A1 | 1/2018 | Stoessel et al. | |

FOREIGN PATENT DOCUMENTS

| | | | |
|---|---|---|---|
| EP | 1400514 A1 | 3/2004 | |
| WO | WO-2014056564 A1 * | 4/2014 | .......... C07F 15/0033 |
| WO | 2014094960 A1 | 6/2014 | |
| WO | 2016124304 A1 | 8/2016 | |

* cited by examiner

Primary Examiner — Dylan C Kershner
Assistant Examiner — Elizabeth M. Dahlburg
(74) Attorney, Agent, or Firm — Faegre Drinker Biddle & Reath LLP

(57) ABSTRACT

The present invention relates to metal complexes and to electronic devices, especially organic electroluminescent devices, comprising these metal complexes. The metal complex is, for example, represented by a compound formula (1) $M(L)_n(L')_m$, containing a substructure $M(L)_n$ of the formula (2), and where M is iridium or platinum.

Formula (2)

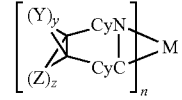

16 Claims, No Drawings

ELECTROLUMINESCENT BRIDGED METAL COMPLEXES FOR USE IN ELECTRONIC DEVICES

RELATED APPLICATIONS

This application is a national stage entry, filed pursuant to 35 U.S.C. § 371, of PCT/EP2016/001143, filed Jul. 4, 2016, which claims the benefit of European Patent Application No. 15178985.6, filed Jul. 30, 2015, which is incorporated herein by reference in its entirety.

The present invention relates to metal complexes suitable for use as emitters in organic electroluminescent devices.

In organic electroluminescent devices (OLEDs) in which organic semiconductors are used as functional materials, emitting materials used are frequently organometallic complexes which exhibit phosphorescence rather than fluorescence. For quantum-mechanical reasons, up to four times the energy efficiency and power efficiency is possible using organometallic compounds as phosphorescent emitters. In general terms, there is still a need for improvement in OLEDs which exhibit triplet emission, especially with regard to efficiency, operating voltage and lifetime.

In this case, triplet emitters used in phosphorescent OLEDs are particularly iridium complexes and platinum complexes. Iridium complexes used are especially bis- and tris-ortho-metallated complexes having aromatic ligands, wherein the ligands bind to the metal via a negatively charged carbon atom and an uncharged nitrogen atom. Examples of such complexes are tris(phenylpyridyl)iridium (III) and derivatives thereof. The literature discloses a multitude of related ligands and iridium complexes or platinum complexes, for example complexes with 1- or 3-phenylisoquinoline ligands, with 2-phenylquinolines or with phenylquinoxalines. Even though good results are already being achieved with such metal complexes, still further improvements are desirable here, especially with regard to the efficiency and lifetime of the complexes.

A further problem that some of the metal complexes according to the prior art have is low solubility in organic solvents. For example, tris(benzo[h]quinoline)iridium(III) is virtually insoluble in a multitude of standard organic solvents, for example in aromatic hydrocarbons or chlorobenzene. As well as the resultant considerably increased difficulty of purification in the preparation of the complexes, the low solubility also makes it difficult or entirely impossible to use these complexes in the solution-processed production of the OLEDs. Access to derivatives having higher solubility would therefore be desirable here, although the derivatization should not worsen the electronic properties thereof.

There is additionally need for improvement in the sublimation properties of some metal complexes according to the prior art. For instance, these have a high sublimation temperature, which in turn means high thermal stress for these materials both in the sublimation for purification after the synthesis and in the production of OLEDs in vacuum-processed methods. Access to derivatives having a lower sublimation temperature would be desirable here, although the derivatization should not worsen the electronic properties thereof.

The problem addressed by the present invention is therefore that of providing novel metal complexes suitable as emitters for use in OLEDs. A particular problem addressed is that of providing emitters which exhibit improved properties in relation to efficiency, operating voltage, lifetime, colour coordinates, solubility and/or oxidation stability.

It has been found that, surprisingly, particular metal chelate complexes described in more detail below solve this problem and are of very good suitability for use in an organic electroluminescent device. The present invention therefore provides these metal complexes and organic electroluminescent devices comprising these complexes.

EP 1400514 discloses iridium complexes with phenylpyridine ligands, in which the phenyl group and the pyridine group are bridged to one another by a linear or branched alkylene group having 2 to 10 carbon atoms. There is no disclosure of structures in which the bridging unit is a cycloalkylene group or a corresponding bicyclic unit. The structures disclosed have a distinct torsion angle of about 15-25° between the pyridine group and the phenyl group. For optimal coordination to the metal and hence higher stability of the complex, the torsion angle, however, should be at a minimum and preferably be 0° or approximately 0°.

The invention provides a compound of formula (1)

$$M(L)_n(L')_m \quad \text{Formula (1)}$$

containing a substructure $M(L)_n$ of the formula (2):

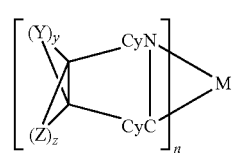

Formula (2)

where the symbols and indices used are as follows:
M is iridium or platinum;
CyC is a structure of the following formula (CyC):

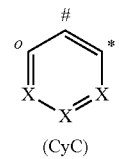

(CyC)

where the group binds to CyN at the position identified by # and coordinates to M at the position identified by * and the bicyclic group, which is described hereinafter by formula (3), is bonded to CyC at the position identified by o;
CyN is a structure of the following formula (CyN):

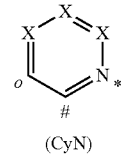

(CyN)

where the group binds to CyC at the position identified by # and coordinates to M at the position identified by * and the bicyclic group, which is described hereinafter by formula (3), is bonded to CyN at the position identified by o;
X is the same or different at each instance and is CR or N, with the proviso that not more than two symbols X in CyC and not more than two symbols X in CyN are N;

Y is the same or different at each instance and is $CR_2$ or O, with the proviso that, when y>1, no oxygen atoms are bonded directly to one another;

Z is the same or different at each instance and is $CR_2$ or N, with the proviso that, when z>1, no oxygen atoms are bonded directly to one another;

R is the same or different at each instance and is H, D, F, Cl, Br, I, $N(R^1)_2$, CN, $NO_2$, OH, $COOR^1$, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which may be substituted by one or more $R^1$ radicals, where one or more nonadjacent $CH_2$ groups may be replaced by $R^1C=CR^1$, $R^1C=N$, C≡C, $Si(R^1)_2$, C=O, $NR^1$, O, S or $CONR^1$ and where one or more hydrogen atoms may be replaced by D, F, Cl, Br, I or CN, or an aromatic or heteroaromatic ring system which has 5 to 40 aromatic ring atoms and may be substituted in each case by one or more $R^1$ radicals, or an aryloxy or heteroaryloxy group which has 5 to 40 aromatic ring atoms and may be substituted by one or more $R^1$ radicals, or an aralkyl or heteroaralkyl group which has 5 to 40 aromatic ring atoms and may be substituted by one or more $R^1$ radicals, or a diarylamino group, diheteroarylamino group or arylheteroarylamino group which has 10 to 40 aromatic ring atoms and may be substituted by one or more $R^1$ radicals; at the same time, two adjacent R radicals together may also form a mono- or polycyclic, aliphatic, aromatic or heteroaromatic ring system;

$R^1$ is the same or different at each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which may be substituted by one or more $R^2$ radicals, where one or more nonadjacent $CH_2$ groups may be replaced by $R^2C=CR^2$, $R^2C=N$, C≡C, $Si(R^2)_2$, C=O, $NR^2$, O, S or $CONR^2$ and where one or more hydrogen atoms may be replaced by D, F, Cl, Br, I, CN or $NO_2$, or an aromatic or heteroaromatic ring system which has 5 to 40 aromatic ring atoms and may be substituted in each case by one or more $R^2$ radicals, or an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals; at the same time, two or more adjacent $R^1$ radicals together may form a mono- or polycyclic, aliphatic, aromatic or heteroaromatic ring system;

$R^2$ is the same or different at each instance and is H, D, F or an aliphatic, aromatic and/or heteroaromatic organic radical having 1 to 20 carbon atoms, in which one or more hydrogen atoms may also be replaced by F; at the same time, two or more $R^2$ substituents together may also form a mono- or polycyclic ring system;

L' is the same or different at each instance and is a ligand;

y is the same or different at each instance and is 1, 2, 3, 4, 5, 6 or 7;

z is the same or different at each instance and is 1, 2, 3, 4, 5, 6 or 7;

n is 1, 2 or 3;

m is 0, 1, 2, 3 or 4;

at the same time, it is also possible for two or more ligands L to be joined together or for L to be joined to L' by a single bond or a bivalent or trivalent bridge, thus forming a tridentate, tetradentate, pentadentate or hexadentate ligand system;

in addition, it is also possible for a substituent R to additionally coordinate to M.

The substructure of the formula (2) therefore has the following structure:

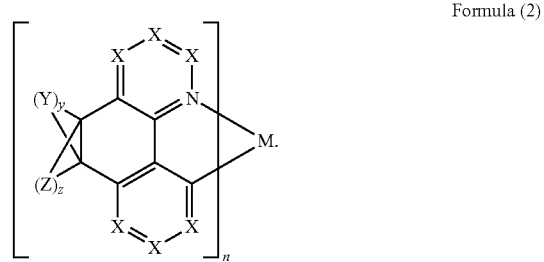

Formula (2)

In the structure of the formula (2), CyC and CyN are joined to one another via a covalent bond. In addition, the presence of a bicyclic bridge that additionally joins CyC and CyN to one another is essential to the invention. According to the invention, the bridge has the structure of the following formula (3):

Formula (3)

where the dotted bond represents the bond to CyC or CyN. When R radicals bonded to Y and/or Z together form a ring system, the bicyclic structure of the formula (3) becomes a polycyclic structure. In a perspective view, the bridge can be represented as follows:

Formula (3)

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. Preferably, the heteroaryl group contains 1, 2 or 3 heteroatoms, of which not more than one is selected from O and S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 60 carbon atoms in the ring system. A heteroaromatic ring system in the context of this invention contains 1 to 60 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for two or more aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl or terphenyl, shall likewise be regarded as an aromatic or heteroaromatic ring system.

A cyclic alkyl, alkoxy or thioalkoxy group in the context of this invention is understood to mean a monocyclic, bicyclic or polycyclic group. When two or more substituents together form an aliphatic ring system, the term "aliphatic ring system" in the context of the present invention also includes heteroaliphatic ring systems.

In the context of the present invention, a $C_1$- to $C_{40}$-alkyl group in which individual hydrogen atoms or $CH_2$ groups may also be substituted by the abovementioned groups are understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-60 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preference is given to compounds of formula (1), characterized in that they are uncharged, i.e. electrically neutral. This is achieved in a simple manner by selecting the charge of the ligands L and L' such that it compensates for the charge of the complexed metal atom M.

In the complexes of the formula (1), the indices n and m are chosen such that the coordination number at the metal M overall, according to the metal, corresponds to the coordination number customary for this metal. This is the coordination number 6 for iridium(III) and the coordination number 4 for platinum(II).

In a preferred embodiment of the invention, M is iridium(III) and the index n is 1, 2 or 3, preferably 2 or 3. When the index n=1, another four monodentate or two bidentate or one bidentate and two monodentate or one tridentate and one monodentate or one tetradentate ligand L', preferably two bidentate ligands L', are coordinated to the metal. When the index n=2, another one bidentate or two monodentate ligands L', preferably one bidentate ligand L', are coordinated to the metal. When the index n=3, the index m=0.

In a further preferred embodiment of the invention, M is platinum(II) and the index n is 1 or 2. When the index n=1, another one bidentate or two monodentate ligands L', preferably one bidentate ligand L', are coordinated to the metal M. When the index n=2, the index m=0.

In a preferred embodiment of the invention, in the group of the formula (CyC), not more than one X is N and the two other X groups are CR. More preferably, in the group of the formula (CyC), all the X groups are CR.

Preferred embodiments of the CyC group are the structures of the following formulae (CyC-1) to (CyC-5), where the groups bind in each case to CyN at the position identified by # and coordinate to M at the position identified by * and the bicyclic group of the formula (3) is bonded at the position identified by o,

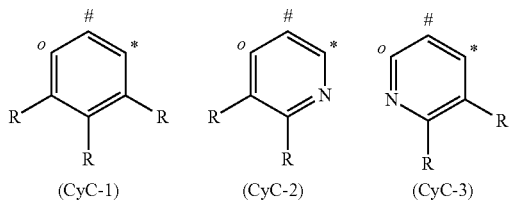

(CyC-1) (CyC-2) (CyC-3)

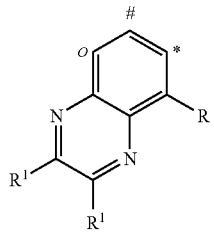

(CyC-4) (CyC-5)

where R has the definitions given above.

As described above, adjacent R radicals together may also form an aliphatic, aromatic or heteroaromatic ring system. Preferred CyC groups which arise in cases (CyC-1b) to (CyC-1k) through ring formation of the R radicals are the (CyC-1a) to (CyC-1k) and (CyC-2a) to (CyC-5a) groups shown below:

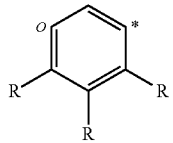

(CyC-1a)

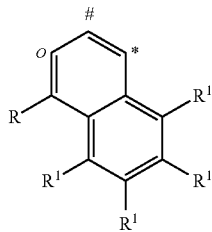

(CyC-1b)

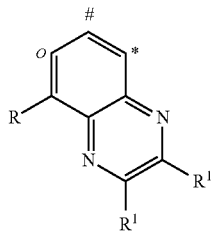

(CyC-1c)

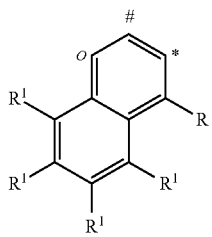

(CyC-1d)

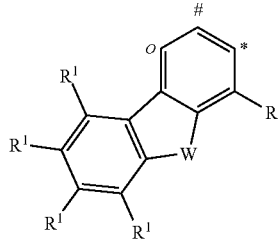

(CyC-1e)

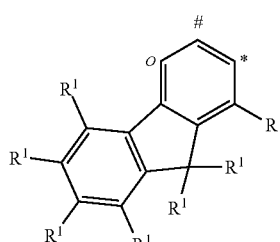

(CyC-1f)

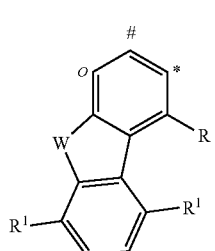

(CyC-1g)

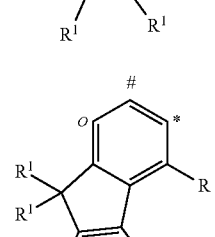

(CyC-1h)

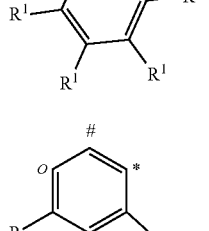

(CyC-1i)

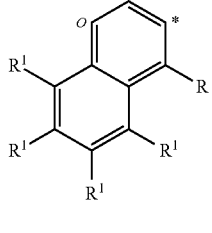

(CyC-1j)

-continued (CyC-1k)
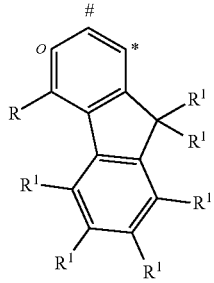

(CyC-2a)
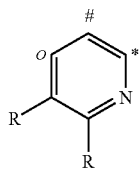

(CyC-3a)
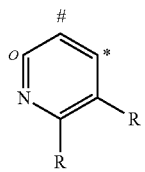

(CyC-4a)
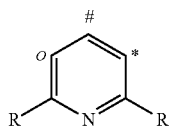

(CyC-5a)
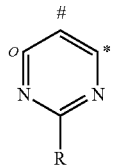

where the symbols used have the definitions given above, W is the same or different at each instance and is $NR^1$, O or S, and the R and $R^1$ radicals preferably do not form an aromatic or heteroaromatic ring system with one another.

Particular preference is given to the groups (CyC-1a), (CyC-1b), (CyC-1f), (CyC-1h) and (CyC-1i), and very particular preference to the group (CyC-1a).

In a preferred embodiment of the invention, in the group of the formula (CyN), not more than one X is N and the two other X groups are CR. More preferably, in the group of the formula (CyN), all the X groups are CR.

Preferred embodiments of the CyN group are the structures of the following formulae (CyN-1) to (CyN-4), where the groups bind in each case to CyC at the position identified by # and coordinate to M at the position identified by * and the bicyclic group of the formula (3) is bonded to CyN at the position identified by o,

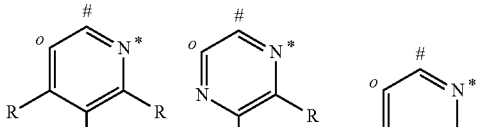

(CyN-1)    (CyN-2)    (CyN-3)

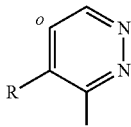

(CyN-4)

where R has the definitions given above.

As described above, adjacent R radicals together may also form an aliphatic, aromatic or heteroaromatic ring system. Preferred CyN groups which arise in cases (CyN-1b), (CyN-1c) and (CyN-2a) through ring formation of the R radicals are the (CyN-1a) to (CyN-1c) and (CyN-2a) groups shown below:

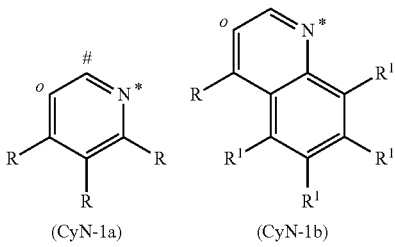

(CyN-1a)    (CyN-1b)

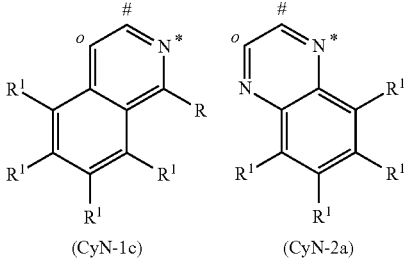

(CyN-1c)    (CyN-2a)

where the symbols used have the definitions given above and the R and $R^1$ radicals preferably do not form an aromatic or heteroaromatic ring system with one another.

Preferred groups are the (CyN-1a), (CyN-1b) and (CyN-1c) groups.

The abovementioned preferred CyC and CyN groups may be combined with one another as desired. Suitable combinations of CyC and CyN in the ligand L are especially as follows:

| No. | CyC | CyN |
|---|---|---|
| 1 | CyC-1 | CyN-1 |
| 2 | CyC-1 | CyN-2 |
| 3 | CyC-1 | CyN-3 |
| 4 | CyC-2 | CyN-1 |
| 5 | CyC-2 | CyN-2 |
| 6% | CyC-2 | CyN-3 |

-continued

| No. | CyC | CyN |
|---|---|---|
| 7 | CyC-3 | CyN-1 |
| 8 | CyC-3 | CyN-2 |
| 9 | CyC-3 | CyN-3 |
| 10% | CyC-4 | CyN-1 |
| 11 | CyC-4 | CyN-2 |
| 12 | CyC-4 | CyN-3 |
| 13 | CyC-5 | CyN-1 |
| 14 | CyC-5 | CyN-2 |
| 15 | CyC-5 | CyN-3 |

It is especially preferred when the CyC and CyN groups specified as particularly preferred above are combined with one another. Particular preference is thus given to the following combinations of CyC and CyN in the ligand L:

| No. | CyC | CyN |
|---|---|---|
| 1 | CyC-1a | CyN-1a |
| 2% | CyC-1a | CyN-1b |
| 3 | CyC-1a | CyN-1c |
| 4 | CyC-1b | CyN-1a |
| 5 | CyC-1b | CyN-1b |
| 6 | CyC-1b | CyN-1c |
| 7 | CyC-1f | CyN-1a |
| 8 | CyC-1f | CyN-1b |
| 9 | CyC-1f | CyN-1c |
| 10 | CyC-1h | CyN-1a |
| 11 | CyC-1h | CyN-1b |
| 12 | CyC-1h | CyN-1c |
| 13% | CyC-1i | CyN-1a |
| 14 | CyC-1i | CyN-1b |
| 15 | CyC-1i | CyN-1c |

Most preferably, the structure of the formula (2) is a structure of the following formula (2a):

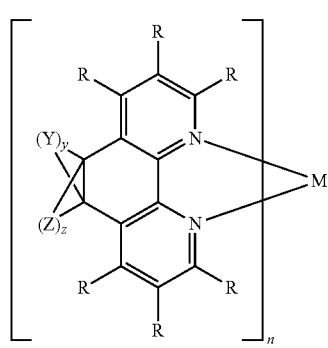

Formula (2a)

where the symbols and indices used have the definitions given above.

When X is CR, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, where one or more hydrogen atoms may be replaced by D or F, or an aromatic or heteroaromatic ring system which has 5 to 24 aromatic ring atoms and may be substituted in each case by one or more $R^1$ radicals; at the same time, two preferably adjacent R radicals together or R together with $R^1$ may also form a ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 6 to 13 aromatic ring atoms and may be substituted in each case by one or more $R^1$ radicals; at the same time, two adjacent R radicals together or R together with $R^1$ may also form a ring system. The same preference also applies to the R radicals depicted in formula (2a) on the phenylpyridine ligand structure.

Preferred $R^1$ radicals are the same or different at each instance and are H, D, F, a straight-chain alkyl or alkoxy group having 1 to 10 carbon atoms or an alkenyl group having 2 to 20 carbon atoms or a branched or cyclic alkyl or alkoxy group having 3 to 10 carbon atoms, each of which may be substituted by one or more $R^2$ radicals, where one or more hydrogen atoms may be replaced by F, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic, aromatic or heteroaromatic ring system. Particularly preferred $R^1$ radicals are the same or different at each instance and are H, D, F, a straight-chain alkyl group having 1 to 4 carbon atoms or a branched or cyclic alkyl group having 3 to 6 carbon atoms or an aromatic or heteroaromatic ring system having 6 to 13 aromatic ring atoms, each of which may be substituted by one or more $R^2$ radicals, but is preferably unsubstituted; at the same time, two or more adjacent $R^1$ radicals together may form a mono- or polycyclic aliphatic, aromatic or heteroaromatic ring system.

As described above, it is essential to the invention that CyN and CyC or the above-detailed preferred embodiments are bridged by a bicyclic group of the formula (3), for which preferred embodiments are detailed hereinafter:

Formula (3)

The group of the formula (3) comprises bicyclic structures, where ring formation of the substituents on this structure may also give rise to a polycyclic structure. By virtue of the bicyclic structure, the group of the formula (3) does not have any benzylic protons. This is advantageous since benzylic protons lower the stability of the metal complexes by virtue of their elevated reactivity.

In a preferred embodiment of the invention, Y and Z are the same or different at each instance and are $CR_2$ or O, where, when y 2, not more than two Y in the $(Y)_y$ group and, when z≥2, not more than two Z in the $(Z)_z$ group are O. More preferably, not more than one Y in the $(Y)_y$ group and not more than one Z in the $(Z)_z$ group are O. Most preferably, Y and Z are the same or different at each instance and are $CR_2$. In a very particularly preferred embodiment, the group is thus a purely aliphatic group and not a heteroaliphatic group.

In a further preferred embodiment of the invention, y and z are the same or different at each instance and are 1, 2, 3, 4 or 5, more preferably 1, 2, 3 or 4, and most preferably 2, 3 or 4. In this context, various combinations of y and z are possible. Examples of suitable combinations of the indices y and z are specified in the following table:

| y | z |
|---|---|
| 2 | 2 |
| 2 | 3 |
| 3% | 3 |
| 3 | 4 |
| 4 | 4 |

When Y and/or Z are $CR_2$, these R radicals are the same or different at each instance and are selected from the group consisting of H, D, F, a straight-chain alkyl group which has 1 to 10 carbon atoms and may be substituted by one or more $R^1$ radicals, but is preferably unsubstituted, a branched or cyclic alkyl group which has 3 to 10 carbon atoms and may be substituted by one or more $R^1$ radicals, but is preferably unsubstituted, or an aromatic or heteroaromatic ring system which has 6 to 13 aromatic ring atoms and may be substituted in each case by one or more $R^1$ radicals; at the same time, it is also possible for two or more R radicals together to form a ring system. More preferably, the R radicals are the same or different at each instance and are selected from the group consisting of H, F, a straight-chain alkyl group having 1 to 4 carbon atoms, a branched alkyl group having 3 or 4 carbon atoms and a phenyl group which may be substituted by an alkyl group having 1 to 4 carbon atoms, but is preferably unsubstituted; at the same time, two or more R radicals together may also form a ring system.

Preferred $R^1$ radicals are the same as already detailed above.

When the R radicals on Y and/or Z together form a ring system, this gives rise to polycyclic structures.

Examples of suitable bicyclic structures of the formula (3) are the structures of the formulae (3a) to (3e) listed hereinafter, and examples of suitable polycyclic structures of the formula (3) are the structures of the formulae (3f) to (3q) listed hereinafter:

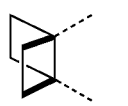

Formula (3a)

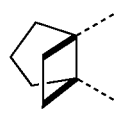

Formula (3b)

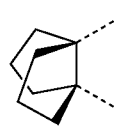

Formula (3c)

Formula (3d)

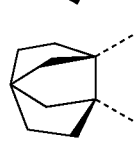

Formula (3e)

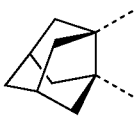

Formula (3f)

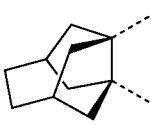

Formula (3g)

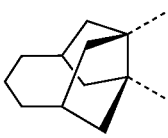

Formula (3h)

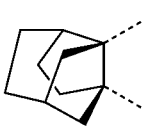

Formula (3i)

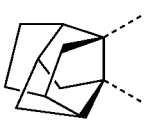

Formula (3j)

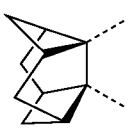

Formula (3k)

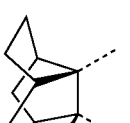

Formula (3l)

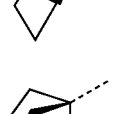

Formula (3m)

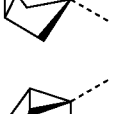

Formula (3n)

Formula (3o)

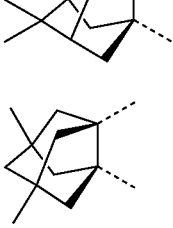

Formula (3p)

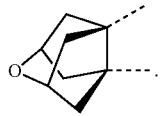

Formula (3q)

These groups may also be substituted by one or more R radicals, where R is preferably an alkyl group having 1 to 4 carbon atoms. However, these groups are preferably unsubstituted.

In a further embodiment of the invention, a substituent R bonded to the coordinating aryl or heteroaryl groups CyC or CyN in the ortho position to the metal coordination is a group that likewise coordinates to the metal M. Preferred coordinating R groups are aryl or heteroaryl groups, for example phenyl or pyridyl, aryl or alkyl cyanides, aryl or alkyl isocyanides, amines or amides, alcohols or alkoxides, thioalcohols or thioalkoxides, phosphines, phosphites, carbonyl functions, carboxylates, carbamides or aryl or alkyl acetylides.

As described above, instead of an R radical, a bridging unit may also be present on the coordinating aryl or heteroaryl groups CyC or CyN and joins the ligand L to one or more further ligands L or L'. In a preferred embodiment of the invention, instead of one of the R radicals which are in the ortho or meta position to the coordinating atom on CyC or CyN, a bridging unit is present, such that the ligands have tridentate or polydentate or polypodal character. It is also possible for two bridging units of this kind to be present. This leads to the formation of macrocyclic ligands or to the formation of cryptates.

Preferred structures having polydentate ligands are the metal complexes of the following formulae (4) to (9):

Formula (4)

Formula (5)

Formula (6)

Formula (7)

Formula (8)

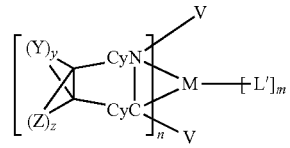

Formula (9)

where the symbols and indices used have the definitions given above.

In these structures of the formulae (4) to (9), V is preferably a single bond or a bridging unit containing 1 to 80 atoms from the third, fourth, fifth and/or sixth main group (group 13, 14, 15 or 16 according to IUPAC) or a 3- to 6-membered homo- or heterocycle which covalently bonds the subligands L to one another or L to L'. In this case, the bridging V unit may also have an unsymmetric structure, meaning that the linkage of V to L and L' need not be identical. The bridging V unit may be uncharged, singly, doubly or triply negatively charged, or singly, doubly or triply positively charged.

Preferably, V is uncharged or singly negatively or singly positively charged, particularly preferably uncharged. In this case, the charge of V is preferably chosen so as to result in an uncharged complex overall. At the same time, the preferences given above for the substructure $ML_n$ apply to the ligands and n is preferably at least 2.

The exact structure and chemical composition of the V group does not have any significant influence on the electronic properties of the complex, since the function of this group is essentially to increase the chemical and thermal stability of the complexes by the bridging of L to one another or to L'.

When V is a trivalent group, i.e. bridges three ligands L to one another or two ligands L to L' or one ligand L to two ligands L', V is preferably the same or different at each instance and is selected from the group consisting of B, $B(R^1)^-$, $B(C(R^1)_2)_3$, $(R^1)B(C(R^1)_2)_3^-$, $B(O)_3$, $(R^1)B(O)_3^-$, $B(C(R^1)_2C(R^1)_2)_3$, $(R^1)B(C(R^1)_2C(R^1)_2)_3^-$, $B(C(R^1)_2O)_3$, $(R^1)B(C(R^1)_2O)_3^-$, $B(OC(R^1)_2)_3$, $(R^1)B(OC(R^1)_2)_3^-$, $C(R^1)$, $CO^-$, $CN(R^1)_2$, $(R^1)C(C(R^1)_2)_3$, $(R^1)C(O)_3$, $(R^1)C(C(R^1)_2C(R^1)_2)_3$, $(R^1)C(C(R^1)_2O)_3$, $(R^1)C(OC(R^1)_2)_3$, $(R^1)C(Si(R^1)_2)_3$, $(R^1)C(Si(R^1)_2C(R^1)_2)_3$, $(R^1)C(C(R^1)_2Si(R^1)_2)_3$, $(R^1)C(Si(R^1)_2Si(R^1)_2)_3$, $Si(R^1)$, $(R^1)Si(C(R^1)_2)_3$, $(R^1)Si(O)_3$, $(R^1)Si(C(R^1)_2C(R^1)_2)_3$, $(R^1)Si(OC(R^1)_2)_3$, $(R^1)Si(C(R^1)_2O)_3$, $(R^1)Si(Si(R^1)_2)_3$, $(R^1)Si(Si(R^1)_2C(R^1)_2)_3$, $(R^1)Si(C(R^1)_2Si(R^1)_2)_3$, $(R^1)Si(Si(R^1)_2Si(R^1)_2)_3$, N, NO, $N(R^1)^+$, $N(C(R^1)_2)_3$, $(R^1)N(C(R^1)_2)_3^+$, $N(C=O)_3$, $N(C(R^1)_2C(R^1)_2)_3$, $(R^1)N(C(R^1)_2C(R^1)_2)_3^+$, P, $P(R^1)^+$, PO, PS, $P(O)_3$, $PO(O)_3$, $P(OC(R^1)_2)_3$, $PO(OC(R^1)_2)_3$, $P(C(R^1)_2)_3$, $P(R^1)(C(R^1)_2)_3^+$, $PO(C(R^1)_2)_3$, $P(C(R^1)_2C(R^1)_2)_3$, $P(R^1)(C(R^1)_2C(R^1)_2)_3^+$, $PO(C(R^1)_2C(R^1)_2)_3$, $S^+$, $S(C(R^1)_2)_3^+$, $S(C(R^1)_2C(R^1)_2)_3^+$, or a unit of formula (10) to (15)

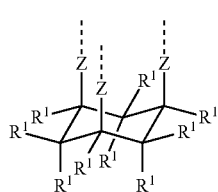

Formula (10)

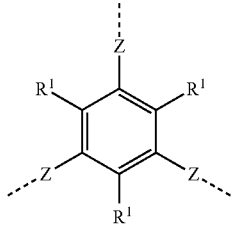

Formula (11)

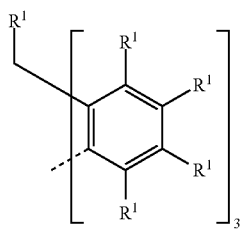

Formula (12)

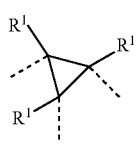

Formula (13)

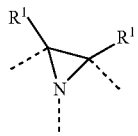

Formula (14)

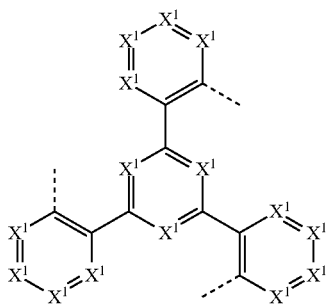

Formula (15)

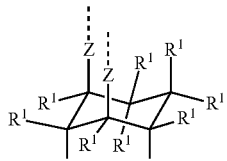

Formula (16)

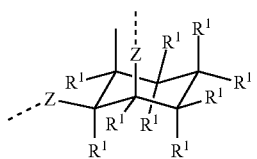

Formula (17)

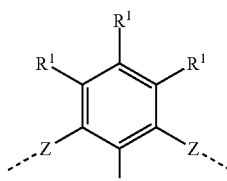

Formula (18)

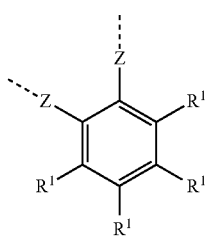

Formula (19)

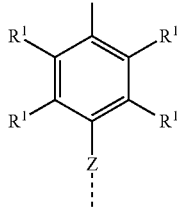

Formula (20)

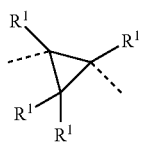

Formula (21)

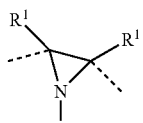

Formula (22)

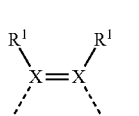

Formula (23)

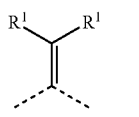

Formula (24)

where the dotted bonds each indicate the bond to the subligands L or L' and Z is the same or different at each instance and is selected from the group consisting of a single bond, O, S, S(=O), S(=O)$_2$, NR$^1$, PR$^1$, P(=O)R$^1$, C(R$^1$)$_2$, C(=O), C(=NR$^1$), C(=C(R$^1$)$_2$), Si(R$^1$)$_2$ and BR$^1$, and X$^1$ is the same or different at each instance and is CR$^1$ or N, where not more than three X$^1$ per cycle are N. The further symbols used have the definitions given above.

When V is a bivalent group, i.e. bridges two ligands L to one another or one ligand L to L', V is preferably the same or different at each instance and is selected from the group consisting of BR$^1$, B(R$^1$)$_2^-$, C(R$^1$)$_2$, C(=O), Si(R$^1$)$_2$, NR$^1$, PR$^1$, P(R$^1$)$_2^+$, P(=O)(R$^1$), P(=S)(R$^1$), O, S, Se, or a unit of formula (16) to (25)

Formula (25)

where the dotted bonds each indicate the bond to the subligand L or L', Q is the same or different at each instance and is $C(R^1)_2$, $N(R^1)$, O or S, and the further symbols used each have the definitions listed above.

There follows a description of preferred ligands L' as occur in formula (1). It is also possible to choose the ligand groups L' correspondingly when they are bonded to L via a bridging V unit, as indicated in formulae (4), (6) and (8).

The ligands L' are preferably uncharged, monoanionic, dianionic or trianionic ligands, more preferably uncharged or monoanionic ligands. They may be monodentate, bidentate, tridentate or tetradentate and are preferably bidentate, i.e. preferably have two coordination sites. As described above, the ligands L' may also be bonded to L via a bridging V group. More preferably, the ligands L' are bidentate and monoanionic.

Preferred uncharged monodentate ligands L' are selected from the group consisting of carbon monoxide, nitrogen monoxide, alkyl cyanides, for example acetonitrile, aryl cyanides, for example benzonitrile, alkyl isocyanides, for example methyl isonitrile, aryl isocyanides, for example benzoisonitrile, amines, for example trimethylamine, triethylamine, morpholine, phosphines, especially halophosphines, trialkylphosphines, triarylphosphines or alkylarylphosphines, for example trifluorophosphine, trimethylphosphine, tricyclohexylphosphine, tri-tert-butylphosphine, triphenylphosphine, tris(pentafluorophenyl)phosphine, dimethylphenylphosphine, methyldiphenylphosphine, bis(tert-butyl)phenylphosphine, phosphites, for example trimethyl phosphite, triethyl phosphite, arsines, for example trifluoroarsine, trimethylarsine, tricyclohexylarsine, tri-tert-butylarsine, triphenylarsine, tris(pentafluorophenyl)arsine, stibines, for example trifluorostibine, trimethylstibine, tricyclohexylstibine, tri-tert-butylstibine, triphenylstibine, tris(pentafluorophenyl)stibine, nitrogen-containing heterocycles, for example pyridine, pyridazine, pyrazine, pyrimidine, triazine, and carbenes, especially Arduengo carbenes.

Preferred monoanionic monodentate ligands L' are selected from hydride, deuteride, the halides F⁻, Cl⁻, Br⁻ and I⁻, alkylacetylides, for example methyl-C≡C⁻, tert-butyl-C≡C⁻, arylacetylides, for example phenyl-C≡C⁻, cyanide, cyanate, isocyanate, thiocyanate, isothiocyanate, aliphatic or aromatic alkoxides, for example methoxide, ethoxide, propoxide, iso-propoxide, tert-butoxide, phenoxide, aliphatic or aromatic thioalkoxides, for example methanethiolate, ethanethiolate, propanethiolate, iso-propanethiolate, tert-thiobutoxide, thiophenoxide, amides, for example dimethylamide, diethylamide, di-iso-propylamide, morpholide, carboxylates, for example acetate, trifluoroacetate, propionate, benzoate, aryl groups, for example phenyl, naphthyl, and anionic nitrogen-containing heterocycles such as pyrrolide, imidazolide, pyrazolide. At the same time, the alkyl groups in these groups are preferably $C_1$-$C_{20}$-alkyl groups, more preferably $C_1$-$C_{10}$-alkyl groups, most preferably $C_1$-$C_4$-alkyl groups. An aryl group is also understood to mean heteroaryl groups. These groups have the definitions given above.

Preferred di- or trianionic ligands are $O^{2-}$, $S^{2-}$, carbides which lead to a coordination of the R—C≡M form, and nitrenes which lead to a coordination of the R—N=M form, where R is generally a substituent, or $N^{3-}$.

Preferred uncharged or mono- or dianionic, bidentate or higher polydentate ligands L' are selected from diamines, for example ethylenediamine, N,N,N",N"-tetramethylethylenediamine, propylenediamine, N,N,N",N"-tetramethylpropylenediamine, cis- or trans-diaminocyclohexane, cis- or trans-N,N,N',N'-tetramethyldiaminocyclohexane, imines, for example 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[(1-(iso-propylimino)ethyl]pyridine, 2-[1-(tert-butylimino)ethyl]pyridine, diimines, for example 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-iso-propylphenylimino)butane, 2,3-bis(2,6-di-tert-butylphenylimino)butane, heterocycles containing two nitrogen atoms, for example 2,2"-bipyridine, o-phenanthroline, diphosphines, for example bis(diphenylphosphino)methane, bis(diphenylphosphino)ethane, bis(diphenylphosphino)propane, bis(diphenylphosphino)butane, bis(dimethylphosphino)methane, bis(dimethylphosphino)ethane, bis(dimethylphosphino)propane, bis(diethylphosphino)methane, bis(diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, for example acetylacetone, benzoylacetone, 1,5-diphenylacetylacetone, dibenzoylmethane, bis(1,1,1-trifluoroacetyl)methane, 3-ketonates derived from 3-ketoesters, for example ethyl acetoacetate, carboxylates derived from aminocarboxylic acids, for example pyridine-2-carboxylic acid, quinoline-2-carboxylic acid, glycine, N,N-dimethylglycine, alanine, N,N-dimethylaminoalanine, salicyliminates derived from salicylimines, for example methylsalicylimine, ethylsalicylimine, phenylsalicylimine, dialkoxides derived from dialcohols, for example ethylene glycol, 1,3-propylene glycol, dithiolates derived from dithiols, for example ethylene-1,2-dithiol, propylene-1,3-dithiol, bis(pyrazolylborates), bis(imidazolyl)borates, 3-(2-pyridyl)diazoles or 3-(2-pyridyl)triazoles.

Preferred tridentate ligands are borates of nitrogen-containing heterocycles, for example tetrakis(1-imidazolyl)borate and tetrakis(1-pyrazolyl)borate.

Preference is further given to bidentate monoanionic, uncharged or dianionic ligands L', especially monoanionic ligands, having, together with the metal, a cyclometallated five-membered ring or six-membered ring having at least one metal-carbon bond, especially a cyclometallated five-membered ring. These are especially ligands as generally used in the field of phosphorescent metal complexes for organic electroluminescent devices, i.e. ligands of the phenylpyridine, naphthylpyridine, phenylquinoline, phenylisoquinoline type, etc., each of which may be substituted by one or more R radicals. The person skilled in the art in the field of phosphorescent electroluminescent devices is aware of a multitude of such ligands, and will be able without exercising inventive skill to select further ligands of this kind as ligand L' for compounds of formula (1). It is generally the case that a particularly suitable combination for the purpose is that of two groups as shown by the formulae (26) to (50) which follow, where one group preferably binds via an uncharged nitrogen atom or a carbene carbon atom and the other group preferably via a negatively charged carbon atom or a negatively charged nitrogen atom. The ligand L' can then be formed from the groups of the formulae (26) to (50) by virtue of these groups each binding to one another at the position indicated by #. The positions at which the groups coordinate to the metal are indicated by *. These groups may also be bonded to the ligands L via one or two bridging V units.

Formula (26)
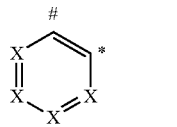

Formula (27)
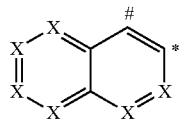

Formula (28)
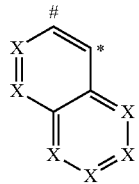

Formula (29)
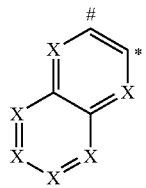

Formula (30)
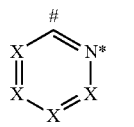

Formula (31)
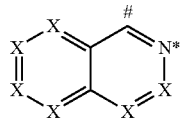

Formula (32)
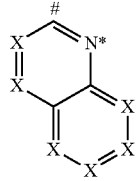

Formula (33)
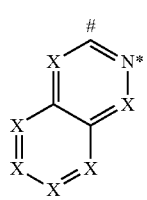

-continued

Formula (34)
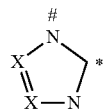

Formula (35)
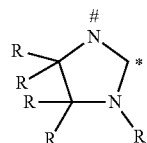

Formula (36)
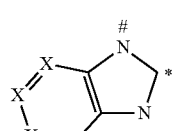

Formula (37)
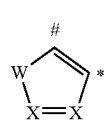

Formula (38)
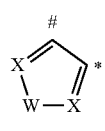

Formula (39)
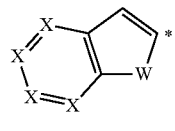

Formula (40)
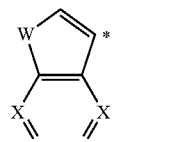

Formula (41)
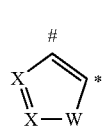

Formula (42)
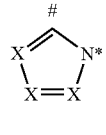

Formula (43)
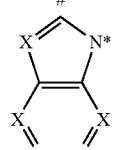

Formula (44)
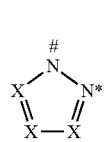

Formula (45)
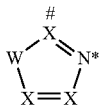

Formula (46)
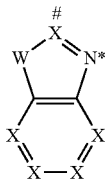

Formula (47)
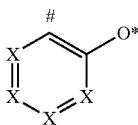

Formula (48)
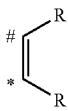

Formula (49)

Formula (50)
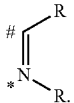

In these formulae, X, R and W have the definitions given above. Preferably not more than three X symbols in each group are N, more preferably not more than two X symbols in each group are N, and even more preferably not more than one X symbol in each group is N. Especially preferably, all X symbols are CR.

At the same time, it is also possible, through ring formation from adjacent substituents, for a fused heteroaryl group to form from the two individual aryl or heteroaryl groups, which coordinates to M as a bidentate ligand L'. Examples of these are the ligands of the following formulae (51), (52) and (53):

Formula (51)
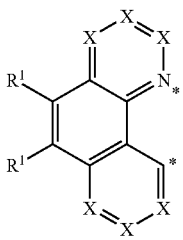

Formula (52)
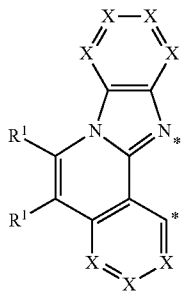

Formula (53)
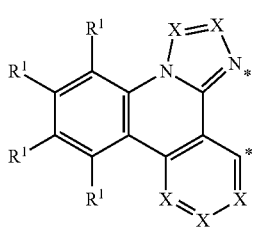

where the symbols used have the definitions given above.

Examples of suitable embodiments of the ligand of the formula (52) can be found in patent applications WO 2010/086089, WO 2011/157339 and WO 2014/008982.

Further suitable coligands L' are structures which are not fully heteroaromatic but which have a keto group in the ligand base structure, as disclosed in WO 2011/044988, WO 2014/094962, WO 2014/094961 and WO 2014/094960.

Examples of suitable coligands L' in which the radicals on the individual coordinating groups form a ring system with one another are listed in the following table, with the CAS number also cited in each case:

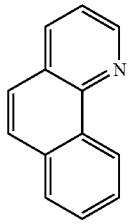
230-27-3

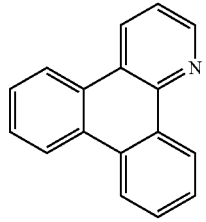
217/−65

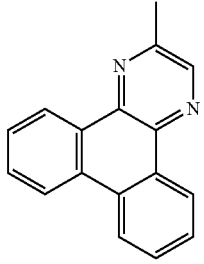
536753-86-3

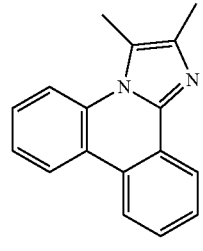
943454/−10

-continued

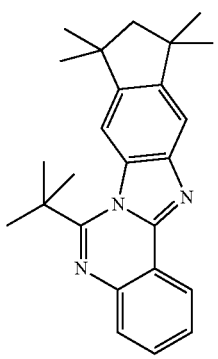

1541107-37-2

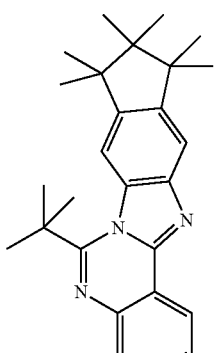

1541107-73-6

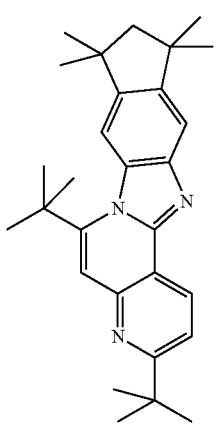

1541109-75-4

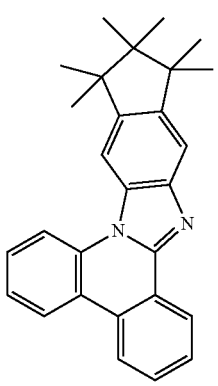

1541112-31-5

-continued

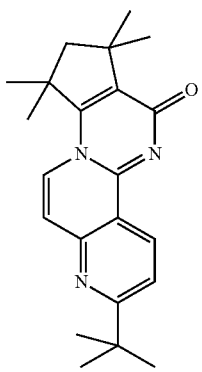

1615218-31-9

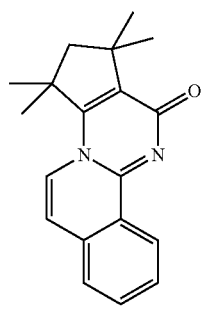

1616465-35-0

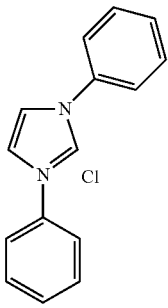

26956-10-5

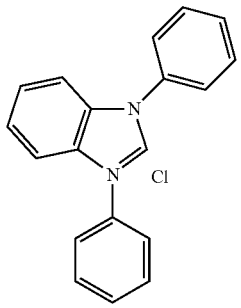

868697-84-2

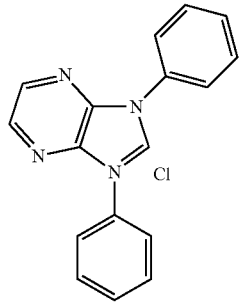

1501154-71-7

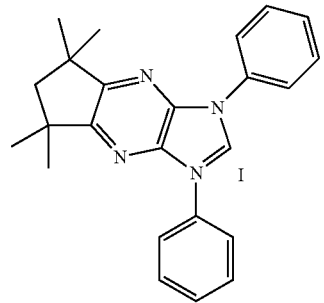

1311465-49-2

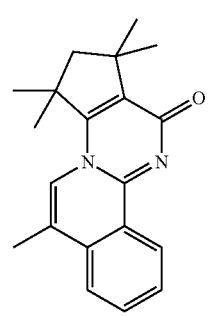

1615694-84-2

1616465-51-0

Likewise preferred ligands L' are $\eta^5$-cyclopentadienyl, $\eta^5$-pentamethylcyclopentadienyl, $\eta^6$-benzene or $\eta^7$-cycloheptatrienyl, each of which may be substituted by one or more R radicals.

Likewise preferred ligands L' are 1,3,5-cis,cis-cyclohexane derivatives, especially of the formula (54), 1,1,1-tri(methylene)methane derivatives, especially of the formula (55), and 1,1,1-trisubstituted methanes, especially of the formula (56) and (57)

Formula (54)

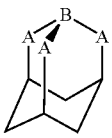

Formula (55)

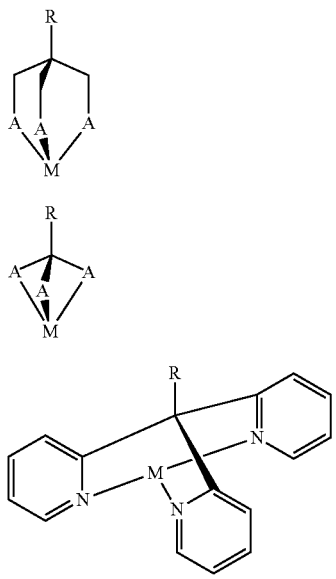

Formula (56)

Formula (57)

formula (60), with dimeric metal complexes of the formula (61) or with metal complexes of the formula (62)

M(OR)$_n$                                    Formula (58)

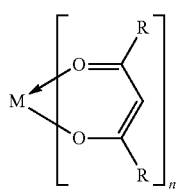                          Formula (59)

MHal$_n$                                      Formula (60)

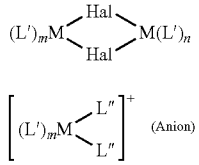                          Formula (61)

$$\left[ (L')_m M \begin{matrix} L'' \\ L'' \end{matrix} \right]^+ \text{(Anion)} \quad \text{Formula (62)}$$

where, in each of the formulae, the coordination to the metal M is shown, R is as defined above and A is the same or different at each instance and is O$^-$, S$^-$, COO$^-$, PR$_2$ or NR$_2$.

When the ligands L' are composed of the structures of the formulae (26) to (50), preferred R radicals in these structures are the same as already detailed above as R radicals for formula (2) when X is CR.

In a preferred embodiment of the invention, L' coordinates via one or more aromatic or heteroaromatic groups to M, but does not coordinate via nonaromatic and non-heteroaromatic groups.

The complexes of the invention may be facial or pseudo-facial, or they may be meridional or pseudomeridional.

The ligands L may also be chiral depending on the structure. This is the case, for example, when the (Y)$_y$ and (Z)$_z$ groups in the structure of the formula (3) are different or when they contain substituents, for example alkyl, alkoxy, dialkylamino or aralkyl groups, having one or more stereocentres. Since the base structure of the complex may also be a chiral structure, the formation of diastereomers and multiple pairs of enantiomers is possible. In that case, the complexes of the invention include both the mixtures of the different diastereomers or the corresponding racemates and the individual isolated diastereomers or enantiomers.

The compounds can also be used as chiral, enantiomerically pure complexes which can emit circular-polarized light. This can have advantages, since this makes it possible to dispense with the polarization filter on the device. In addition, such complexes are also suitable for use in security labels since, as well as the emission, they also have the polarization of light as an easily readable feature.

The abovementioned preferred embodiments can be combined with one another as desired. In a particularly preferred embodiment of the invention, the abovementioned preferred embodiments apply simultaneously.

The present invention further provides a process for preparing the metal complex compounds of formula (1) by reacting the corresponding free ligands L and optionally L' with metal alkoxides of the formula (58), with metal ketoketonates of the formula (59), with metal halides of the where the symbols M, m, n and R have the definitions given above, Hal=F, Cl, Br or I, L'' is an alcohol, especially an alcohol having 1 to 4 carbon atoms or a nitrile, especially acetonitrile or benzonitrile, and (Anion) is a non-coordinating anion, for example triflate.

It is likewise possible to use metal compounds, especially iridium compounds, bearing both alkoxide and/or halide and/or hydroxyl radicals and ketoketonate radicals. These compounds may also be charged. Corresponding iridium compounds of particular suitability as reactants are disclosed in WO 2004/085449. Particularly suitable are [IrCl$_2$(acac)$_2$]$^-$, for example Na[IrCl$_2$(acac)$_2$], metal complexes with acetylacetonate derivatives as ligand, for example Ir(acac)$_3$ or tris(2,2,6,6-tetramethylheptane-3,5-dionato)iridium, and IrCl$_3$.xH$_2$O where x is typically a number from 2 to 4. Suitable platinum reactants are, for example, PtCl$_2$, K$_2$[PtCl$_4$], PtCl$_2$(DMSO)$_2$, Pt(Me)$_2$(DMSO)$_2$ or PtCl$_2$(benzonitrile)$_2$.

The synthesis of the complexes is preferably conducted as described in WO 2002/060910, WO 2004/085449 and WO 2007/065523. Heteroleptic complexes can be synthesized, for example, according to WO 2005/042548 as well. In this case, the synthesis can, for example, also be activated by thermal or photochemical means and/or by microwave radiation. For activation of the reaction, it is additionally also possible to add a Lewis acid, for example a silver salt or AlCl$_3$.

The reactions can be conducted without addition of solvents or melting aids in a melt of the corresponding ligands to be o-metallated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulphoxides (DMSO) or sulphones (dimethyl sulphone, sulpholane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, 1,2-, 1,3- or 1,4-bisphenoxybenzene, triphenylphosphine oxide, 18-crown-6, phenol, 1-naphthol, hydroquinone, etc.

It is possible by these processes, if necessary followed by purification, for example recrystallization or sublimation, to obtain the inventive compounds of formula (1) in high purity, preferably more than 99% (determined by means of $^1$H NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Such compounds are then soluble in sufficient concentration at room temperature in standard organic solvents, for example toluene or xylene, to be able to process the complexes from solution. These soluble compounds are of particularly good suitability for processing from solution, for example by printing methods.

The compounds of the invention may also be mixed with a polymer. It is likewise possible to incorporate these compounds covalently into a polymer. This is especially possible with compounds substituted by reactive leaving groups such as bromine, iodine, chlorine, boronic acid or boronic ester, or by reactive polymerizable groups such as olefins or oxetanes. These may find use as monomers for production of corresponding oligomers, dendrimers or polymers. The oligomerization or polymerization is preferably effected via the halogen functionality or the boronic acid functionality or via the polymerizable group. It is additionally possible to crosslink the polymers via groups of this kind. The compounds of the invention and polymers may be used in the form of a crosslinked or uncrosslinked layer.

The invention therefore further provides oligomers, polymers or dendrimers containing one or more of the above-detailed compounds of the invention, wherein one or more bonds of the compound of the invention to the polymer, oligomer or dendrimer are present. According to the linkage of the compound of the invention, it therefore forms a side chain of the oligomer or polymer or is incorporated in the main chain. The polymers, oligomers or dendrimers may be conjugated, partly conjugated or nonconjugated. The oligomers or polymers may be linear, branched or dendritic. For the repeat units of the compounds of the invention in oligomers, dendrimers and polymers, the same preferences apply as described above.

For preparation of the oligomers or polymers, the monomers of the invention are homopolymerized or copolymerized with further monomers. Preference is given to copolymers wherein the units of formula (1) or the above-recited preferred embodiments are present to an extent of 0.01 to 99.9 mol %, preferably 5 to 90 mol %, more preferably 20 to 80 mol %. Suitable and preferred comonomers which form the polymer base skeleton are chosen from fluorenes (for example according to EP 842208 or WO 2000/022026), spirobifluorenes (for example according to EP 707020, EP 894107 or WO 2006/061181), paraphenylenes (for example according to WO 92/18552), carbazoles (for example according to WO 2004/070772 or WO 2004/113468), thiophenes (for example according to EP 1028136), dihydrophenanthrenes (for example according to WO 2005/014689), cis- and trans-indenofluorenes (for example according to WO 2004/041901 or WO 2004/113412), ketones (for example according to WO 2005/040302), phenanthrenes (for example according to WO 2005/104264 or WO 2007/017066) or else a plurality of these units. The polymers, oligomers and dendrimers may contain still further units, for example hole transport units, especially those based on triarylamines, and/or electron transport units.

For the processing of the compounds of the invention from the liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, hexamethylindane, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention therefore still further provides a formulation comprising a compound of the invention or an oligomer, polymer or dendrimer of the invention and at least one further compound. The further compound may, for example, be a solvent. The further compound may alternatively be a further organic or inorganic compound which is likewise used in the electronic device, for example a matrix material. This further compound may also be polymeric.

A valuable intermediate compound for preparation of the compounds of the invention is the corresponding free ligands. The invention therefore further provides a compound of the following formula (63):

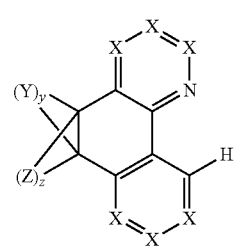

Formula (63)

where the symbols and indices used have the definitions given above. At the same time, the preferences mentioned above for the metal complexes of the invention also apply correspondingly to the free ligands of the formula (63).

The above-described compounds of formula (1) and the above-detailed preferred embodiments can be used as active component in the electronic device. The invention therefore further provides for the use of a compound of formula (1) or according to the preferred embodiments in an electronic device.

An electronic device is understood to mean any device comprising anode, cathode and at least one layer, said layer comprising at least one organic or organometallic compound. The electronic device of the invention thus comprises anode, cathode and at least one layer comprising at least one compound of the above-detailed formula (1). Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) and organic laser diodes (O-lasers), comprising at least one compound of the above-detailed formula (1) in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce.

In a preferred embodiment of the invention, the organic electroluminescent device comprises the compound of formula (1) or the above-detailed preferred embodiments as emitting compound in one or more emitting layers.

When the compound of formula (1) is used as emitting compound in an emitting layer, it is preferably used in combination with one or more matrix materials. The mixture of the compound of formula (1) and the matrix material contains between 0.1% and 99% by volume, preferably between 1% and 90% by volume, more preferably between 3% and 40% by volume and especially between 5% and 15% by volume of the compound of formula (1), based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulphoxides and sulphones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the inventive complexes of formula (1) as co-matrix for longer-wave emitting triplet emitters, for example for green- or red-emitting triplet emitters.

The compounds of the invention can also be used in other functions in the electronic device, for example as hole transport material in a hole injection or transport layer, as charge generation material or as electron blocker material. It is likewise possible to use the complexes of the invention as matrix material for other phosphorescent metal complexes in an emitting layer.

It is also possible to use the free ligands of the formula (63) directly in electronic devices, especially in organic electroluminescent devices, in various functions according to the exact structure and substitution.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled.

Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example, M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapour deposition. For example, it is possible to apply an emitting layer comprising a compound of formula (1) and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. Organic electroluminescent devices comprising the compounds of the invention as emitting materials have a very good lifetime. More particularly, the lifetime is improved compared to analogous compounds according to the prior art which, rather than a group of the formula (3), have a corresponding aliphatic bridge having no bicyclic or polycyclic structure.

2. The metal complexes of the invention have very good thermal stability.

3. The metal complexes of the invention have excellent solubility in a multitude of organic solvents, especially in organic hydrocarbons. At the same time, solubility is significantly improved compared to analogous compounds containing no structural unit of the formula (3). This leads to simplified purification during the synthesis of the complexes, and to excellent suitability thereof in the production of OLEDs in solution processing methods, for example printing methods.

35

4. The metal complexes of the invention have very high oxidation stability under air and light, and so the processing thereof is possible from solution, for example by printing methods, even under air.
5. The metal complexes of the invention have reduced aggregation compared to analogous compounds containing no structural unit of formula (3). This is manifested in a lower sublimation temperature compared to analogous complexes containing no structural unit of formula (3).

These abovementioned advantages are not accompanied by a deterioration in the further electronic properties.

The invention is illustrated in detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature.

36

A: Synthesis of the Synthons S and ligands L:

Example S1 and L1

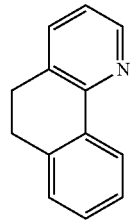 [SMILES: c1ccc2c(c1)CCc1cccnc1-2]

Analogous to G. Abbiati et al., J. Org. Chem., 2003, 68, 18, 6959.

73.1 g (500 mmol) of 1-tetralone [529-34-0], 44.1 g (800 mmol) of propargylamine [2450-71-7] and 2.9 g (10 mmol) of sodium dichloroaurate(I) [21534-24-7] in 1000 ml of abs. ethanol are stirred in an autoclave at 130° C. for 12 h. After cooling, the EtOH is removed under reduced pressure, and the residue is taken up in 300 ml of dichloromethane and filtered through a silica gel bed. After the filtrate has been concentrated, the residue is distilled under reduced pressure (p about 0.05 mbar, T about 185° C.). Yield: 58.9 g (325 mmol), 65%; purity: about 98% by $^1$H NMR.

The following compounds can be prepared in an analogous manner, it being possible to purify the crude products by distillation, Kugelrohr distillation, recrystallization or chromatography:

| Ex. | Reactant | Product | Yield |
|---|---|---|---|
| L2 | 91814-04-0 | | 28% |
| S2 | 86419-92-3 | | 63% |
| S3 | 51015-29-3 | | 58% |

-continued
| Ex. | Reactant | Product | Yield |
|---|---|---|---|
| S4 | 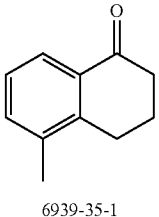 6939-35-1 | 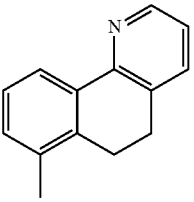 | 60% |
| S5 | 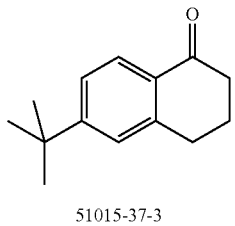 51015-37-3 | 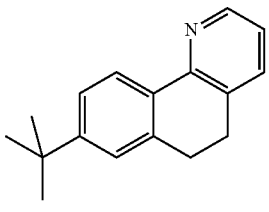 [SMILES: CC(C)(C)c1ccc2c(c1)CCc1cccnc1-2] | 71% |
| S6 | 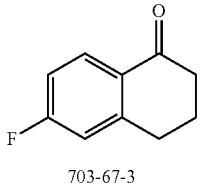 [SMILES: O=C1CCCc2cc(F)ccc21] 703-67-3 | 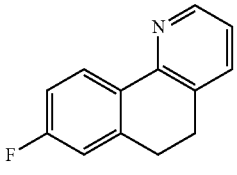 [SMILES: Fc1ccc2c(c1)CCc1cccnc1-2] | 66% |
| S7 | 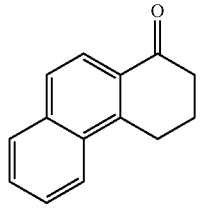 573-22-8 | 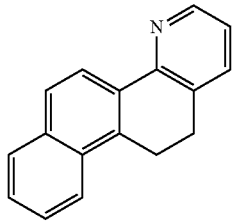 [SMILES: c1cnc2c(c1)CCc1c-2ccc2ccccc12] | 78% |
| S8 | 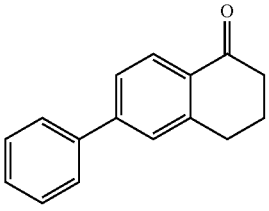 71912-46-4 | 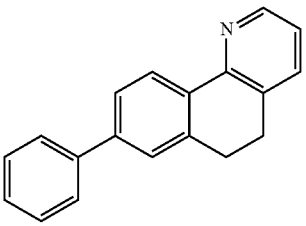 [SMILES: c1ccc(-c2ccc3c(c2)CCc2cccnc2-3)cc1] | 56% |
| S9 | 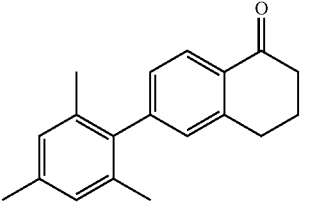 127255-71-4 | 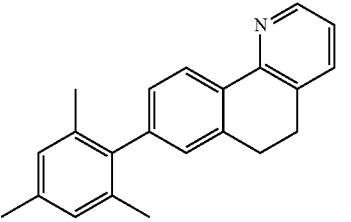 [SMILES: Cc1cc(C)c(-c2ccc3c(c2)CCc2cccnc2-3)c(C)c1] | 63% |

-continued

| Ex. | Reactant | Product | Yield |
|---|---|---|---|
| S10 | 53400-41-2 | | 70% |
| S11 | 21917-86-2 | | 73% |
| S12 | 38229/-67 | | 53% |
| S13 | 38312-61-7 | | 55% |
| L3 | S14 | | 31% |
| L4 | S15 | | 27% |

Example S14

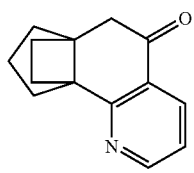 [SMILES: O=C1CC23CCCC2(CC3)c2ncccc21]

Analogous to L. Ren et al., Green Chemistry, 2015, 17, 2369.

To a mixture of 2.0 g (10 mmol) of S12, 6.9 g (50 mmol) of tert-butyl hydroperoxide [75-91-2] (65% by weight in water) and 50 ml of tert-butanol are added, at 25° C., 35 mg (0.1 mmol) of manganese(II) trifluoromethanesulphonate [55120-76-8], and the mixture is stirred for 30 h. 45 ml of the solvent are removed under reduced pressure, 200 ml of water are added to the residue, and the mixture is extracted three times with 200 ml each time of dichloromethane. The combined extracts are washed five times with 200 ml each time of water and twice with 100 ml each time of saturated sodium chloride solution, and dried over magnesium sulphate. The oil remaining after the solvent has been removed is used without further purification. Yield: 1.7 g (7.9 mmol), 79%; purity: about 95% by ¹H NMR.

In an analogous manner, it is possible to prepare S15 from S13. Yield 76%.

Example S16

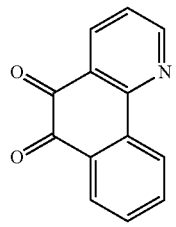 [SMILES: O=C1C(=O)c2cccnc2-c2ccccc21]

To a mixture of 45.3 g (250 mmol) of S1, 250 ml of glacial acetic acid and 250 ml of acetic anhydride are added in portions, with good stirring, 10 portions each of 11.2 g (375 mmol) of sodium dichromate dihydrate every 30 min, and then the mixture is stirred at room temperature for 1 day and at 35° C. for 3 days. Then the yellow suspension is stirred cautiously (exothermic!) into 5 kg of ice and stirred for a further 30 min., and the yellow solids are filtered off with suction, washed five times with 300 ml each time of water and dried by suction. The crude product is dissolved in 500 ml of dichloromethane and filtered through a silica gel bed. The dichloromethane is removed under reduced pressure and the solids are extracted by stirring once with 200 ml of hot methanol. Yield: 29.9 g (143 mmol), 57%; purity: about 99% by ¹H NMR.

In an analogous manner, it is possible to prepare the following compounds:

| Ex. | Reactant | Product | Yield |
|---|---|---|---|
| S17 | ![S2 reactant] | ![S2 product] | 63% |
| S18 | ![S3 reactant] | ![S3 product] | 18% |
| S19 | ![S4 reactant] | ![S4 product] | 21% |
| S20 | ![S5 reactant] | ![S5 product] | 64% |

-continued
| Ex. | Reactant | Product | Yield |
|---|---|---|---|
| S21 | 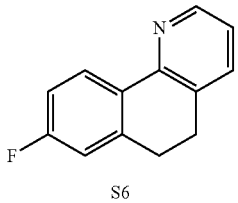 S6 | 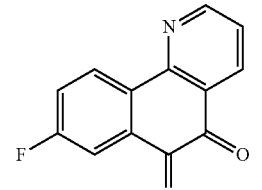 | 60% |
| S22 | 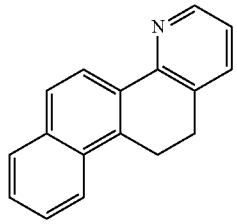 S7 | 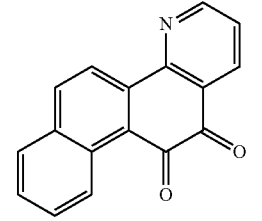 [SMILES: O=C1C(=O)c2c(ccc3ccccc23)-c2ncccc21] | 78% |
| S23 | 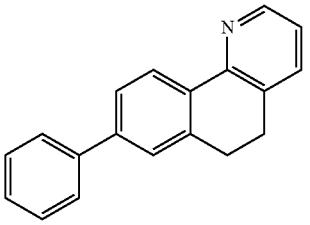 S8 | 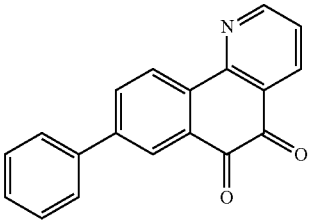 [SMILES: O=C1C(=O)c2cccnc2-c2ccc(-c3ccccc3)cc21] | 71% |
| S24 | 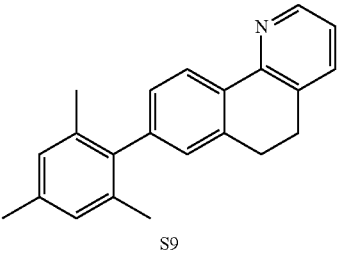 S9 | 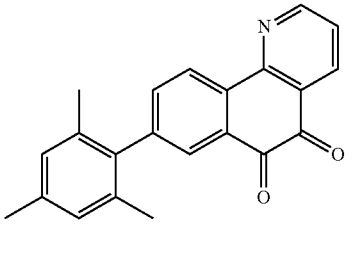 [SMILES: Cc1cc(C)c(-c2ccc3c(c2)C(=O)C(=O)c2cccnc2-3)c(C)c1] | 34% |
| S25 | 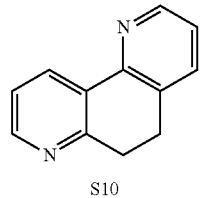 S10 | 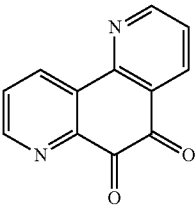 [SMILES: O=C1C(=O)c2ncccc2-c2ncccc21] | 48% |
| S26 | 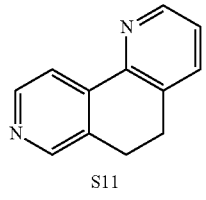 S11 | 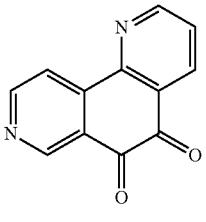 [SMILES: O=C1C(=O)c2cccnc2-c2ccncc21] | 55% |

Example S27

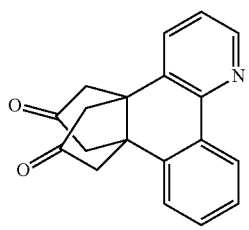 [SMILES: O=C1CC23CC(=O)CC2(C1)c1cccnc1-c1ccccc13]

A sodium methoxide solution is prepared from 23.0 g (1 mol) of sodium and 2000 ml of methanol. To the latter are added, while stirring, 87.1 g (500 mmol) of dimethyl 1,3-acetonedicarboxylate [1830-54-2] and the mixture is stirred for a further 10 min. Then 41.8 g (200 mmol) of S16 are added in solid form. After stirring under reflux for 16 h, the methanol is removed under reduced pressure. To the residue are cautiously added 1000 ml of glacial acetic acid (caution: foaming!), and to the brown solution are added 60 ml of water and 180 ml of conc. hydrochloric acid. The reaction mixture is heated under reflux for 16 h, then allowed to cool, poured onto 5 kg of ice and neutralized while cooling by addition of solid sodium hydroxide solution. The precipitated solids are filtered off with suction, washed three times with 300 ml each time of water and dried under reduced pressure. The crude product is stirred in 2000 ml of dichloromethane at 40° C. for 1 h and then filtered while still warm through a Celite bed in order to remove insoluble fractions. After the dichloromethane has been removed under reduced pressure, the residue is dissolved in 100 ml of dioxane at boiling and then 500 ml of methanol are added dropwise starting from 80° C. After cooling and stirring at room temperature for a further 12 h, the solids are filtered off with suction, washed with a little methanol and dried under reduced pressure. Yield: 29.5 g (102 mmol), 51%; purity: about 90% by $^1$H NMR. The product thus obtained is converted further without purification.

In an analogous manner, it is possible to prepare the following compounds:

| Ex. | Reactant | Product | Yield |
|---|---|---|---|
| S28 | S17 | | 50% |
| S29 | S18 | | 53% |
| S30 | S19 | | 48% |
| S31 | S20 | | 57% |

-continued
| Ex. | Reactant | Product | Yield |
|---|---|---|---|
| S32 | 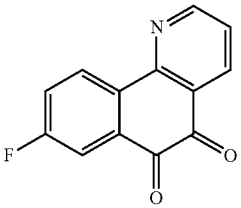<br>S21 | 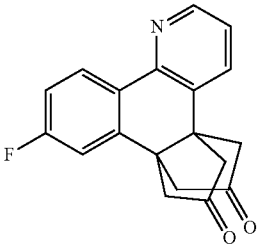 | 55% |
| S33 | 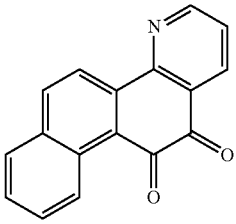<br>S22 | 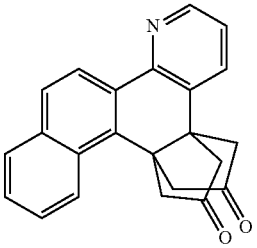 | 21% |
| S34 | 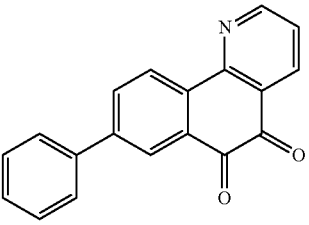<br>S23 | 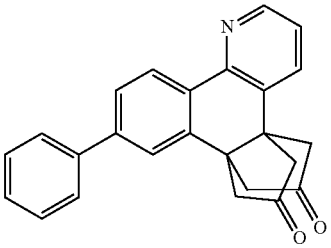 | 59% |
| S35 | 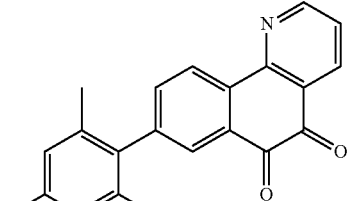<br>S24 | 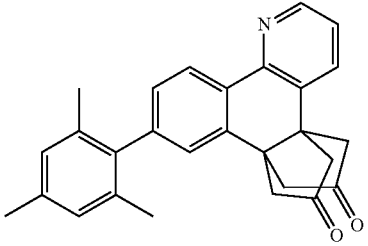 | 54% |
| S36 | 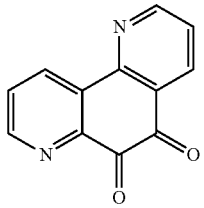<br>S25 | 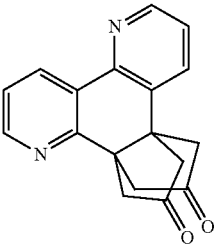 | 63% |
| S37 | 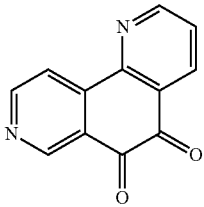<br>S26 | 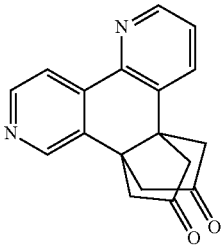 | 60% |

-continued

| Ex. | Reactant | Product | Yield |
|---|---|---|---|
| S38 | 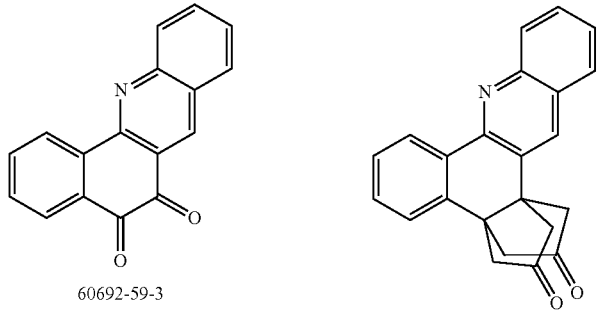 60692-59-3 | 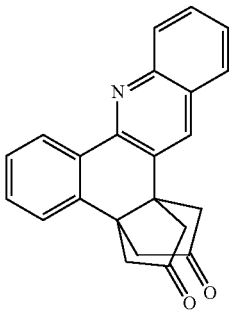 | 55% |
| S39 | 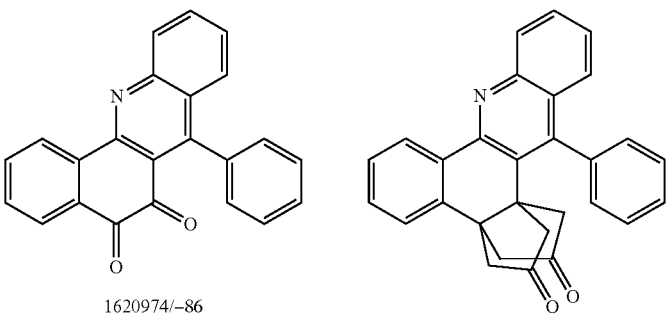 1620974/-86 | 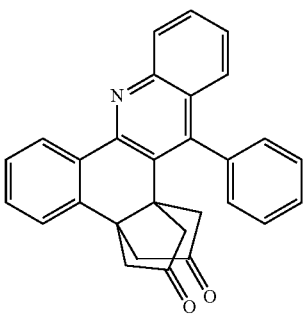 | 11% |

Example L5

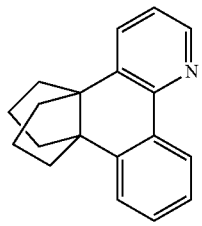 [SMILES: c1ccc2c(c1)-c1ncccc1C13CCCC21CCC3]

A mixture of 28.9 g (100 mmol) of S27, 50.1 g (1 mol) of hydrazine hydrate, 67.3 g (1.2 mol) of potassium hydroxide and 400 ml of ethylene glycol is heated under reflux for 4 h. Then the temperature is increased gradually and the water formed and excess hydrazine hydrate are distilled off on a water separator. After 16 h under reflux, the reaction mixture is allowed to cool, poured into 2 l of water and extracted three times with 500 ml each time of dichloromethane. The dichloromethane phase is washed five times with 300 ml each time of water and twice with 300 ml each time of saturated sodium chloride solution, and dried over magnesium sulphate. After the dichloromethane has been removed under reduced pressure, the oily residue is chromatographed on silica gel with dichloromethane (Rf about 0.6). For further purification, the pale yellow oil thus obtained can be subjected to Kugelrohr distillation or recrystallized from methanol. Yield: 12.0 g (46 mmol), 46%; purity: about 99% by $^1$H NMR.

In an analogous manner, it is possible to prepare the following compounds:

| Ex. | Reactant | Product | Yield |
|---|---|---|---|
| L6 | 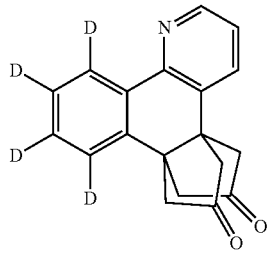 S28 | 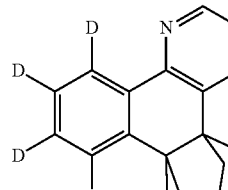 | 51% |

-continued
| Ex. | Reactant | Product | Yield |
|---|---|---|---|
| L7 | 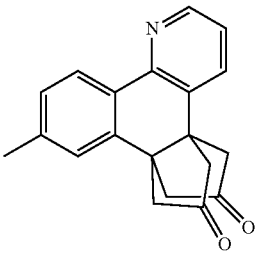 S29 | 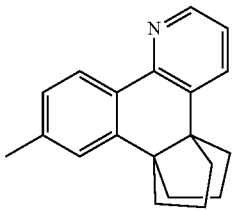 [SMILES: Cc1ccc2c(c1)C13CCCC1(CCC3)c1cccnc1-2] | 48% |
| L8 | 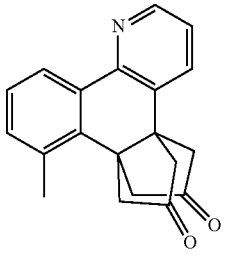 S30 | 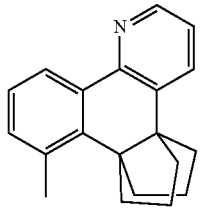 [SMILES: Cc1cccc2c1C13CCCC1(CCC3)c1cccnc1-2] | 43% |
| L9 | 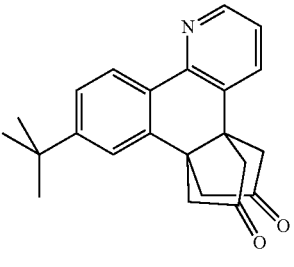 S31 | 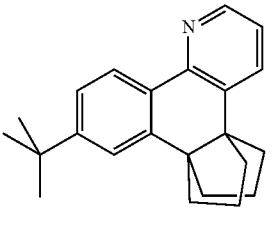 [SMILES: CC(C)(C)c1ccc2c(c1)C13CCCC1(CCC3)c1cccnc1-2] | 55% |
| L10 | 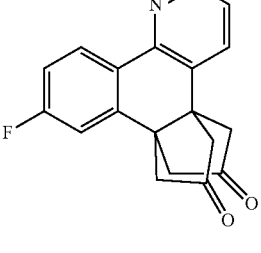 S32 | 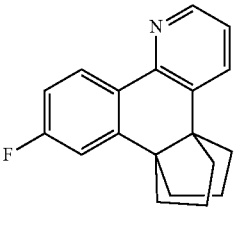 [SMILES: Fc1ccc2c(c1)C13CCCC1(CCC3)c1cccnc1-2] | 21% |
| L11 | 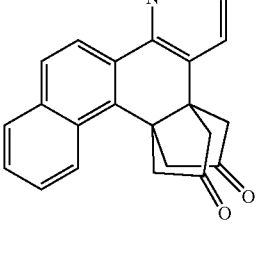 S33 | 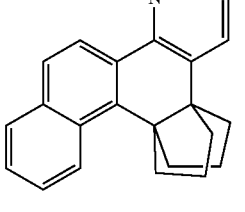 | 62% |

-continued
| Ex. | Reactant | Product | Yield |
|---|---|---|---|
| L12 | 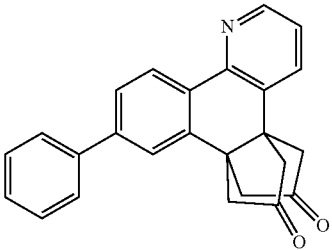<br>S34 | 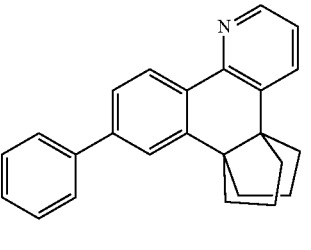 [SMILES: c1ccc(-c2ccc3c(c2)C24CCCC2(CCC4)c2cccnc2-3)cc1] | 58% |
| L13 | 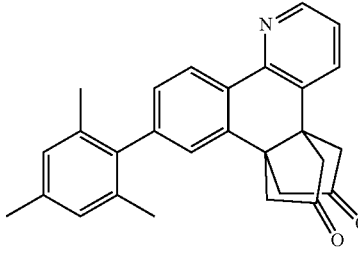<br>S35 | 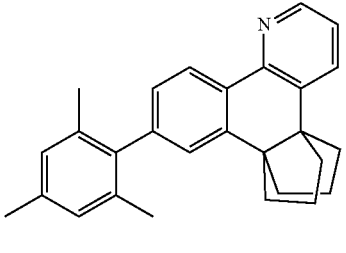 [SMILES: Cc1cc(C)c(-c2ccc3c(c2)C24CCCC2(CCC4)c2cccnc2-3)c(C)c1] | 61% |
| L14 | 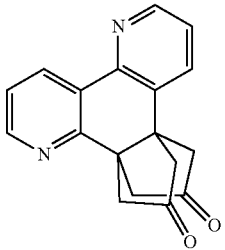<br>S36 | 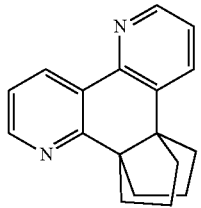 [SMILES: c1cnc2c(c1)-c1ncccc1C13CCCC21CCC3] | 59% |
| L15 | 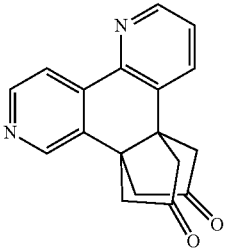<br>S37 | 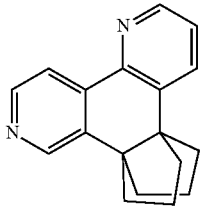 [SMILES: c1cnc2c(c1)C13CCCC1(CCC3)c1cnccc1-2] | 50% |
| L16 | 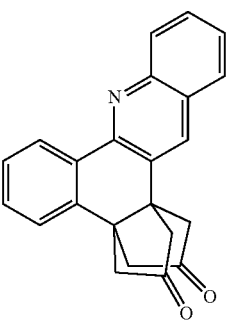<br>S38 | 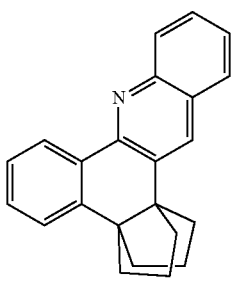 [SMILES: c1ccc2c(c1)-c1nc3ccccc3cc1C13CCCC21CCC3] | 63% |

| Ex. | Reactant | Product | Yield |
|---|---|---|---|
| L17 | (S39) | | 31% |

C: Synthesis of the Metal Complexes:
1) Tris-Facial Homoleptic Ir Complexes

Example Ir(L5)₃

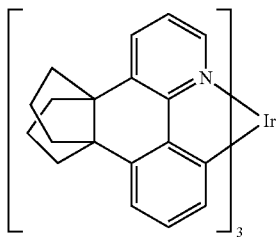

Variant A:

A mixture of 9.2 g (35 mmol) of ligand L5, 4.90 g (10 mmol) of trisacetylacetonatoiridium(III) [15635-87-7] and 100 g of hydroquinone [123-31-9] is initially charged in a 500 ml two-neck round-bottomed flask with a glass-sheathed magnetic core. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer core. Then the apparatus is thermally insulated with several loose windings of domestic aluminium foil, the insulation being run up to the middle of the riser tube of the water separator. Then the apparatus is heated rapidly with a heated laboratory stirrer system to 260° C., measured with the Pt-100 thermal sensor which dips into the molten stirred reaction mixture. Over the next 1.5 h, the reaction mixture is kept at 260° C., in the course of which a small amount of condensate is distilled off and collects in the water separator. After cooling to 100° C., 500 ml of methanol are cautiously added to the melt cake, and boiled until a yellow suspension has formed. The yellow suspension thus obtained is filtered through a double-ended frit (P3), and the yellow solids are washed three times with 100 ml of methanol and then dried under reduced pressure. Crude yield: quantitative. The yellow product is purified further by continuous hot extraction five times with toluene (amount initially charged in each case about 150 ml, extraction thimble: standard Soxhlet thimbles made from cellulose from Whatman) with careful exclusion of air and light. Finally, the product is subjected to fractional sublimation under high vacuum (p about 10⁻⁵ mbar, T 340° C.). Yield: 7.6 g (7.8 mmol), 78%. Purity: >99.9% by HPLC.

Variant B:

Procedure analogous to Example Ir(L5)₃, Variant A, except that 300 ml of ethylene glycol [107-21-1] are used rather than 100 g of hydroquinone and the mixture is stirred under reflux for 48 h. After cooling to 70° C., the mixture is diluted with 300 ml of ethanol, and the solids are filtered off with suction (P3), washed three times with 100 ml each time of ethanol and dried under reduced pressure. Further purification is effected as described in Variant A. Yield: 4.4 g (4.5 mmol), 45%. Purity: >99.9% by HPLC.

Variant C:

Sodium [cis,trans-dichloro(bisacetylacetonato]iridate(III) as Iridium Reactant

A mixture of 10 mmol of sodium [cis,trans-dichloro (bisacetylacetonato]iridate(III) [876296-21-8] and 40 mmol of the ligand in 100 ml of ethylene glycol (or else alternatively propylene glycol or diethylene glycol) is heated under gentle reflux under a gentle argon stream for the time specified. After cooling to 60° C., the mixture is diluted while stirring with a mixture of 50 ml of ethanol and 50 ml of 2 N hydrochloric acid and stirred for a further 1 h, and the precipitated solids are filtered off with suction, washed three times with 30 ml each time of ethanol and then dried under reduced pressure. Purification as described under A. Yield: 5.9 g (6.1 mmol), 61%. Purity: >99.9% by HPLC.

The purification of the complexes obtained according to Variant A, B and C can, as well as purification by repeated hot extraction, also be effected by recrystallization or by chromatography.

If chiral ligands are used, the fac metal complexes derived are obtained as a diastereomer mixture. The enantiomers Λ,Δ of the C3 point group generally have much lower solubility in the extractant than the enantiomers of the C1 point group, which consequently accumulate in the mother liquor. Separation of the C3 from the C1 diastereomers in this way is frequently possible. In addition, the diastereomers can also be separated by chromatography. If ligands of the C1 point group are used in enantiomerically pure form, a Λ,Δ diastereomer pair of the C3 point group is the result. The diastereomers can be separated by crystallization or chromatography and hence be obtained as enantiomerically pure compounds.

In an analogous manner, it is possible to prepare the following compounds:

| Product | Ligand | Variant Reaction time* Reaction temperature* Extractant* | Yield |
|---|---|---|---|
| Ir(L1)$_3$ (comp.) | L1 | A | 42% |
| Ir(L2)$_3$ (comp.) | L2 | A 2 h ethyl acetate | 26% |
| Ir(L3)$_3$ | L3 | A diastereomer mixture | 56% |
| Ir(L4)$_3$ | L4 | A diastereomer mixture | 58% |
| Ir(L6)$_3$ | L6 | A 3 h | 76% |
| Ir(L7)$_3$ | L7 | A | 78% |
| Ir(L8)$_3$ | L8 | A | 75% |
| Ir(L9)$_3$ | L9 | A C, 60 h | 81% 69% |
| 10/3 | L10 | A B | 58% 46% |
| Ir(11)$_3$ | L11 | A 2 h mesitylene | 80% |
| Ir(L12)$_3$ | L12 | A | 76% |
| Ir(L13)$_3$ | L13 | A | 81% |
| Ir(L14)$_3$ | L14 | A 3% 270° C. | 66% |
| Ir(L15)$_3$ | L15 | A 3 h 270° C. | 63 |

*if different from the conditions described

2) Iridium Complexes of the [Ir(L)$_2$Cl]2 Type

Variant A:

A mixture of 22 mmol of the ligand, 10 mmol of iridium (III) chloride hydrate [876296-21-8], 75 ml of 2-ethoxyethanol and 25 ml of water is heated under reflux with good stirring for 16-24 h. If the ligand dissolves incompletely in the solvent mixture if at all under reflux, 1,4-dioxane is added until a solution has formed. After cooling, the precipitated solids are filtered off with suction, washed twice with ethanol/water (1:1, v/v) and then dried under reduced pressure. The chloro dimer of the formula [Ir(L)$_2$Cl]$_2$ thus obtained is converted further without purification.

Variant B:

A mixture of 10 mmol of sodium bisacetylacetonatodichloroiridate(III) [876296-21-8] and 22 mmol of the ligand L and a glass-ensheathed magnetic stirrer bar are sealed by melting under reduced pressure ($10^{-5}$ mbar) into a thick-wall 100 ml glass ampoule. Hydroquinone may be added as a melting aid and reaction medium. The ampoule is heated at the temperature specified for the time specified, in the course of which the molten mixture is stirred with the aid of a magnetic stirrer. After cooling (CAUTION: the ampoules are usually under pressure!), the ampoule is opened, the sinter cake is stirred with 100 g of glass beads (diameter 3 mm) in 100 ml of the suspension medium specified (the suspension medium is chosen such that the ligand has good solubility but the chloro dimer of the formula [Ir(L)$_2$Cl]$_2$ has sparing solubility therein; typical suspension media are methanol, ethanol, dichloromethane, acetone, ethyl acetate, toluene, etc.) for 3 h and mechanically digested in the process. The fine suspension is decanted off from the glass beads, and the [(Ir(L)$_2$ Cl]$_2$ solids, which still contain about 2 eq of NaCl, referred to hereinafter as the crude chloro dimer, are filtered off with suction and dried under reduced pressure. The crude chloro dimer of the formula [Ir(L)$_2$Cl]$_2$ thus obtained is converted further without purification.

| Ex. | Ligand L | Ir complex Variant Temp./time Melting aid Suspension medium | Yield |
|---|---|---|---|
| [Ir(L5)₂Cl]₂ | L5 | A | 76% |
| [Ir(L5)₂Cl]₂ | L5 | [Ir(L5)₂Cl]₂<br>B<br>230° C./12 h<br>hydroquinone | 81% |
| [Ir(L7)₂Cl]₂ | L7 | [Ir(L7)₂Cl]₂<br>B<br>230° C./12 h | 84% |
| [Ir(L9)₂Cl]₂ | L9 | [Ir(L9)₂Cl]₂<br>B<br>230° C./12 h | 93% |
| [Ir(L12)₂Cl]₂ | L12 | [Ir(L12)₂Cl]₂<br>B<br>230° C./12 h<br>hydroquinone | 90% |
| [Ir(L14)₂Cl]₂ | L14 | [Ir(L14)₂Cl]₂<br>B<br>240° C./12 h | 76% |
| [Ir(L16)₂Cl]₂ | L16 | [Ir(L16)₂Cl]₂<br>B<br>230° C./12 h | 92% |
| [Ir(L17)₂Cl]₂ | L17 | [Ir(L17)₂Cl]₂<br>B<br>230° C./12 h | 89% |

3) Iridium Complexed of the [Ir(L)₂(HOME)₂]OTf Type

To a suspension of 5 mmol of the chloro dimer [Ir(L)₂Cl]₂ in 150 ml of dichloromethane are added 5 ml of methanol and then 10 mmol of silver(I) trifluoromethanesulphonate [2923-28-6], and the mixture is stirred at room temperature for 18 h. The precipitated silver(I) chloride is filtered off with suction through a Celite bed, the filtrate is concentrated to dryness, the yellow residue is taken up in 30 ml of toluene or cyclohexane, and the solids are filtered off, washed with n-heptane and dried under reduced pressure. The product of the formula [Ir(L)₂(HOMe)₂]OTf thus obtained is converted further without purification.

| Ex. | [Ir(L)₂Cl]₂ | [Ir(L)₂(HOMe)₂]OTf | Yield |
|---|---|---|---|
| [Ir(L5)₂(HOMe)₂]OTf | Ir[(L5)Cl]₂ | | 81% |
| [Ir(L7)₂(HOMe)₂]OTf | [Ir(L7)₂Cl]₂ | [Ir(L7)₂(HOMe)₂]OTf | 85% |
| [Ir(L9)₂(HOMe)₂]OTf | [Ir(L9)₂Cl]₂ | [Ir(L9)₂(HOMe)₂]OTf | 79% |
| [Ir(L12)₂(HOMe)₂]OTf | [Ir(L12)₂Cl]₂ | [Ir(L12)₂(HOMe)₂]OTf | 74% |
| [Ir(L14)₂(HOMe)₂]OTf | [Ir(L14)₂Cl]₂ | [Ir(L14)₂(HOMe)₂]OTf | 83% |
| [Ir(L16)₂(HOMe)₂]OTf | [Ir(L16)₂Cl]₂ | [Ir(L16)₂(HOMe)₂]OTf | 91% |
| [Ir(L17)₂(HOMe)₂]OTf | [Ir(L17)₂Cl]₂ | [Ir(L17)₂(HOMe)₂]OTf | 88% |

4) Heteroleptic Tris-Facial Iridium Complexes:

A mixture of 10 mmol of the ligand L or L', 10 mmol of bis(methanol)bis[2-(2-pyridinyl-κN]phenyl-κC]iridium(III) trifluoromethanesulphonate [1215692-14-0] or inventive iridium complexes of the [Ir(L)₂(HOMe)₂]OTf type, 11 mmol of 2,6-dimethylpyridine and 150 ml of ethanol is heated under reflux for 40 h. After cooling, the precipitated solids are filtered off with suction, washed three times with 30 ml each time of ethanol and dried under reduced pressure. The crude product thus obtained is chromatographed on silica gel (solvents or mixtures thereof, for example ethyl acetate, DCM, THF, toluene, n-heptane, cyclohexane), and fractionally sublimed as described in 1) Variant A.

| Ex. | [Ir(L)₂(HOMe)₂]OTf Ligand L | Ir complex Diastereomer | Yield |
|---|---|---|---|
| Ir200 (comp.) | 1215692-14-0 L1 | | 27% |
| Ir201 | 1215692-14-0 L3 | Diastereomer mixture Separation by means of chromatography DCM/silica gel | 39% |
| Ir202 | 1215692-14-0 L5 | | 44% |
| Ir203 | [Ir(L5)₂(HOMe)₂]OTf 1008-89-5 | | 48% |
| Ir204 | [Ir(L5)₂(HOMe)₂]OTf 26274-35-1 | | 45% |

| Ex. | [Ir(L)₂(HOMe)₂]OTf Ligand L | Ir complex Diastereomer | Yield |
|---|---|---|---|
| Ir205 | [Ir(L5)₂(HOMe)₂]OTf 156021-09-8 | 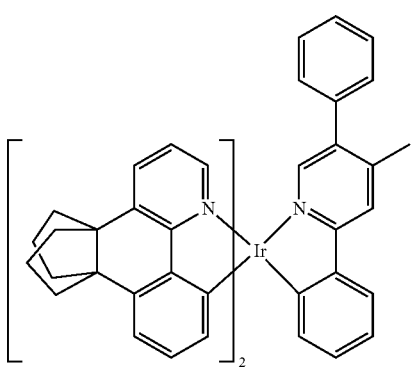 | 50% |
| Ir206 | [Ir(L5)₂(HOMe)₂]OTf 1609373-99-0 | 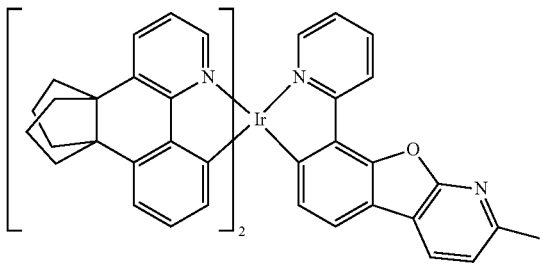 | 54% |
| Ir207 | [Ir(L5)₂(HOMe)₂]OTf 1609374-17-5 | 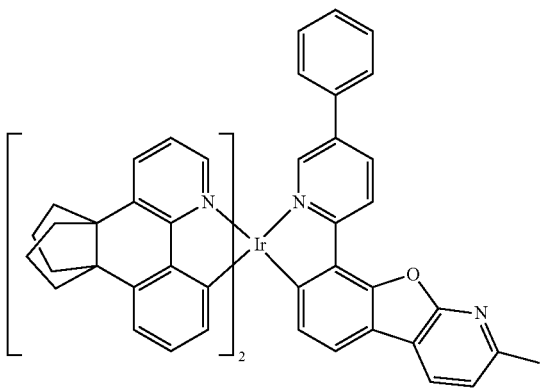 | 51% |
| Ir208 | [Ir(L12)₂(HOMe)₂]OTf 1609374-06-2 | 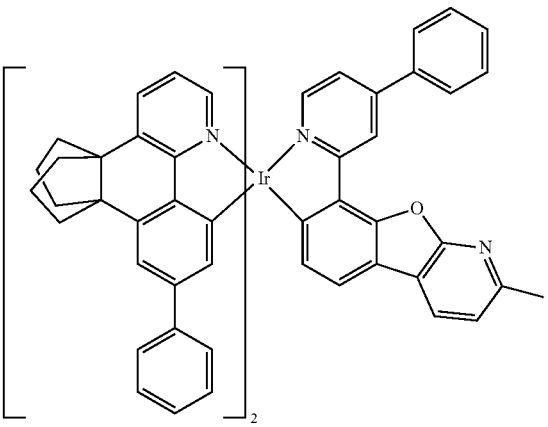 | 46% |

-continued

| Ex. | [Ir(L)₂(HOMe)₂]OTf Ligand L | Ir complex Diastereomer | Yield |
|---|---|---|---|
| Ir209 | [Ir(L14)₂(HOMe)₂]OTf 1609374/-23 | | 48% |
| Ir210 | [Ir(L5)₂(HOMe)₂]OTf L7 | | 50% |
| Ir211 | [Ir(L5)₂(HOMe)₂]OTf L9 | | 50% |
| Ir212 | [Ir(L5)₂(HOMe)₂]OTf L11 | | 44% |
| Ir213 | [Ir(L5)₂(HOMe)₂]OTf L12 | | 47% |

-continued

| Ex. | [Ir(L)₂(HOMe)₂]OTf Ligand L | Ir complex Diastereomer | Yield |
|---|---|---|---|
| Ir214 | [Ir(L5)₂(OMe)₂]OTf L14 | | 34% |
| Ir215 | [Ir(L14)₂(HOMe)₂]OTf L5 | | 52% |
| Ir216 | [Ir(L14)₂(HOMe)₂]OTf L13 | | 49% |
| Ir217 | [Ir(L5)₂(HOMe)₂]OTf 230-27-3 | | 31% |

-continued

| Ex. | [Ir(L)₂(HOMe)₂]OTf Ligand L | Ir complex Diastereomer | Yield |
|---|---|---|---|
| Ir218 | [Ir(L14)₂(HOMe)₂]OTf 1541107/−37 | | 39% |
| Ir219 | [Ir(L14)₂(HOMe)₂]OTf 914306-48-2 | | 40% |

5) Heteroleptic Iridium Complexes Containing Ligands of the Arduengo Carbene Type:

Preparation analogous to A. G. Tennyson et al., Inorg. Chem., 2009, 48, 6924.

A mixture of 22 mmol of the ligand precursor (imidazolium salt), 10 mmol of iridium chloro dimer [Ir(L)₂Cl]2, 10 mmol of silver(I) oxide and 300 ml of 1,2-dichloroethane is stirred at 90° C. for 30 h. After cooling, the precipitated solids are filtered off with suction through a Celite bed and washed once with 30 ml of 1,2-dichloroethane, and the filtrate is concentrated to dryness under reduced pressure. The crude product thus obtained is chromatographed on silica gel (solvents or mixtures thereof, for example ethyl acetate, dichloromethane, THF, toluene, n-heptane, cyclohexane), and fractionally sublimed as described in 1) Variant A.

| Ex. | [Ir(L)₂Cl]₂ Ligand L | Ir complex | Yield |
|---|---|---|---|
| Ir300 | [Ir(L14)₂(HOMe)₂]OTf 1610514-63-0 | | 35% |

6) Iridium Complexes of the Ir(L)₂L' Type Containing Non-o-Metallated Ligands L'

A mixture of 25 mmol of the ligand L', 10 mmol of iridium chloro dimer [Ir(L)₂Cl]₂, 30 mmol of sodium hydrogencarbonate, 100 ml of 2-ethoxyethanol and 30 ml of water is stirred at 90° C. for 16 h. After cooling, the precipitated solids are filtered off with suction, washed three times with 30 ml each time of ethanol and dried under reduced pressure. The crude product thus obtained is chromatographed on silica gel (solvents or mixtures thereof, for example ethyl acetate, dichloromethane, THF, toluene, n-heptane, cyclohexane) or recrystallized, and fractionally sublimed as described in 1) Variant A.

| Ex. | [Ir(L)₂Cl]₂<br>Ligand L' | Ir complex<br>Diastereomer | Yield |
|---|---|---|---|
| Ir400 | [Ir(L5)₂Cl]₂<br>123/-54 | N,N-trans, C₂ | 79% |
| Ir401 | [Ir(L9)₂Cl]₂<br>1118-71-4 | N,N-trans, C₂ | 71% |
| Ir402 | [Ir(L16)₂Cl]₂<br>123-54-6 | N,N-trans, C₂ | 77% |
| Ir403 | [Ir(L17)₂Cl]₂<br>123-54-6 | N,N-trans, C₂ | 68% |

| Ex. | [Ir(L)$_2$Cl]$_2$ Ligand L' | Ir complex Diastereomer | Yield |
|---|---|---|---|
| Ir404 | [Ir(L16)$_2$Cl]$_2$ 1118-71-4 | N,N-trans, C$_2$ | 76% |
| Ir405 | [Ir(L17)$_2$Cl]$_2$ 1118-71-4 | N,N-trans, C$_2$ | 69% |
| Ir406 | [Ir(L5)$_2$Cl]$_2$ 1137-68-4 | | 71% |

7) Platinum Complexes of the PtLL' Type Containing Non-o-Metallated Ligands L'

Preparation analogous to J. Brooks et al., Inorg. Chem. 2002, 41, 3055. A mixture of 20 mmol of the ligand L, 10 mmol of K$_2$PtCl$_4$, 75 ml of 2-ethoxyethanol and 25 ml of water is heated under reflux for 16 h. After cooling and addition of 100 ml of water, the precipitated solids are filtered off with suction, washed once with 30 ml of water and dried under reduced pressure. The platinum chloro dimer of the formula [PtLCl]$_2$ thus obtained is suspended in 100 ml of 2-ethoxyethanol, 30 mmol of the ligand L' and 50 mmol of sodium carbonate are added, and the reaction mixture is stirred at 100° C. for 16 h and then concentrated to dryness under reduced pressure. The crude product thus obtained is chromatographed on silica gel (solvents or mixtures thereof, for example ethyl acetate, dichloromethane, THF, toluene, n-heptane, cyclohexane) or recrystallized, and fractionally sublimed as described in 1) Variant A.

| Ex. | Ligand L Ligand L' | Pt complex | Yield |
|---|---|---|---|
| Pt001 | L5<br>123-54-6 | | 36% |
| Pt002 | L16<br>1118-71-4 | | 44% |
| Pt003 | L16<br>867291-13-2 | | 51% |

Comparison of Thermal Stability

For comparison of thermal stability, 50 mg each of the compounds Ir(L1)$_3$ (comparative example according to EP 1400514) and Ir(L5)$_3$, and also Ir200 (comparative example) and Ir202, are sealed by melting in glass ampoules under reduced pressure (p about $10^{-5}$ mbar) and then heated to 350° C. with exclusion of light for 14 days. After the thermal treatment has ended, the samples are examined for changes by means of visual assessment by eye and HPLC-MS. The inventive complexes Ir(L5)$_3$ and Ir202 appear unchanged after the thermal treatment has ended, assessed visually by eye. It is not possible to detect any changes with the aid of HPLC-MS. The complexes Ir(L1)$_3$ and Ir200 (comparative examples) have taken on an orange-brown discolouration. With the aid of HPLC-MS, it is possible to detect decomposition in the order of magnitude of about 0.5% (several species). The mass of the decomposition peaks (M+-2H and M+-4H) suggests that a portion of the dihydrobenzo[h]quinoline ligands has been converted to benzo[h]quinoline ligands by elimination of hydrogen (dehydrogenation). This thermal decomposition is highly problematic for OLED construction, since the complexes formed by dehydrogenation are likewise emissive in the OLED but emit at a much longer wavelength than the starting complexes, such that there can be colour shifts in the OLED components in the course of system operation.

Comparison of Photochemical Stability 1 mmolar solutions of Ir(L1)$_3$ (comparative example) and Ir(L5)$_3$ in toluene are left to stand in test tubes under air and daylight for 10 h. Thereafter, the samples are examined by means of thin-layer chromatography (silica gel plates, eluent: toluene:DCM 9:1). Ir(L5)$_3$ shows no change compared to the original sample. The chromatogram of Ir(L1)$_3$ (comparative example) shows several secondary components (starting spot and two spots having lower Rf than the sample) that are not observed in the original material. According to NMR studies, the instability of the comparative complex is attributable to the reaction of the CH$_2$ groups of the dihydrobenzo[h]quinoline ligand with singlet oxygen generated by triplet sensitization, forming oxidation products (hydroperoxides, alcohols, ketones). These oxidation products have an adverse effect on the properties (for example the component lifetime) of OLED components processed from solution under standard laboratory conditions.

Production of the OLEDs

1) Vacuum-Processed Devices

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Glass plaques with structured ITO (50 nm, indium tin oxide) form the substrates to which the OLEDs are applied. The OLEDs basically have the following layer structure: substrate/hole transport layer 1 (HTL1) consisting of HTM doped with 3% NDP-9 (commercially available from Novaled), 20 nm/hole transport layer 2 (HTL2)/optional electron blocker layer (EBL)/emission layer (EML)/optional hole blocker layer (HBL)/electron transport layer (ETL)/optional electron injection layer (EIL) and finally a cathode. The cathode is formed by an aluminium layer of thickness 100 nm.

First of all, vacuum-processed OLEDs are described. For this purpose, all the materials are applied by thermal vapour deposition in a vacuum chamber. In this case, the emission layer always consists of at least one matrix material (host material) and an emitting dopant (emitter) which is added to the matrix material(s) in a particular proportion by volume by co-evapouration. Details given in such a form as M3:M2:Ir(L1)$_3$ (55%:35%:10%) mean here that the material M3 is present in the layer in a proportion by volume of 55%, M2 in a proportion of 35% and Ir(L1)$_3$ in a proportion of 10%. Analogously, the electron transport layer may also consist of a mixture of two materials. The exact structure of the OLEDs can be found in Table 1. The materials used for production of the OLEDs are shown in Table 3.

The OLEDs are characterized in a standard manner. For this purpose, the electroluminescence spectra, the power efficiency (measured in cd/A) and the voltage (measured at 1000 cd/m$^2$ in V) are determined from current-voltage-brightness characteristics (IUL characteristics). For selected experiments, the lifetime is determined. The lifetime is defined as the time after which the luminance has fallen from a particular starting luminance to a certain proportion. The figure LD50 means that the lifetime specified is the time at which the luminance has dropped to 50% of the starting luminance, i.e. from, for example, 1000 cd/m$^2$ to 500 cd/m$^2$. According to the emission colour, different starting brightnesses were selected. The values for the lifetime can be converted to a figure for other starting luminances with the aid of conversion formulae known to those skilled in the art. In this context, the lifetime for a starting luminance of 1000 cd/m$^2$ is a standard figure.

Use of Compounds of the Invention as Emitter Materials in Phosphorescent OLEDs

One use of the compounds of the invention is as phosphorescent emitter materials in the emission layer in OLEDs. The iridium compounds according to Table 4 are used as a comparison according to the prior art. The results for the OLEDs are collated in Table 2.

TABLE 1

Structure of the OLEDs

| Ex. | HTL2 thickness | EBL thickness | EML thickness | HBL thickness | ETL thickness |
|---|---|---|---|---|---|
| Red OLEDs | | | | | |
| D-IrR1 comp. | HTM 50 nm | — | M7:M8:IrR1 (60%:35%:5%) 40 nm | ETM1 10 nm | ETM1:ETM2 (50%:50%) 40 nm |
| D-Ir402 | HTM 50 nm | — | M7:M8:Ir402 (60%:35%:5%) 40 nm | ETM1 10 nm | ETM1:ETM2 (50%:50%) 40 nm |
| D-Ir404 | HTM 50 nm | — | M7:M8:Ir404 (60%:35%:5%) 40 nm | ETM1 10 nm | ETM1:ETM2 (50%:50%) 40 nm |
| Yellow OLEDs | | | | | |
| D-IrY1 comp. | HTM 40 nm | — | M7:M8:IrY1 (62%:30%:8%) 30 nm | ETM1 10 nm | ETM1:ETM2 (50%:50%) 45 nm |
| D-Ir(L11)$_3$ | HTM 40 nm | — | M7:M8:Ir(L11)$_3$ (62%:30%:8%) 30 nm | ETM1 10 nm | ETM1:ETM2 (50%:50%) 45 nm |
| D-Ir204 | HTM 40 nm | — | M7:M8:Ir204 (62%:30%:8%) 30 nm | ETM1 10 nm | ETM1:ETM2 (50%:50%) 45 nm |
| D-Ir217 | HTM 40 nm | — | M7:M8:Ir217 (60%:30%:10%) 30 nm | ETM1 10 nm | ETM1:ETM2 (50%:50%) 45 nm |
| Green OLEDs | | | | | |
| D-IrG1 comp. | HTM 30 nm | — | M7:M8:IrG1 (60%:30%:10%) 30 nm | ETM1 10 nm | ETM1:ETM2 (50%:50%) 35 nm |
| D-IrG2 comp. | HTM 30 nm | — | M7:M8:IrG2 (60%:30%:10%) 30 nm | ETM1 10 nm | ETM1:ETM2 (50%:50%) 35 nm |
| D-Ir(L1)$_3$ comp. | HTM 30 nm | — | M7:M8:Ir(L1)$_3$ (60%:30%:10%) 30 nm | ETM1 10 nm | ETM1:ETM2 (50%:50%) 35 nm |
| D-Ir(L2)$_3$ comp. | HTM 30 nm | — | M7:M8:Ir(L2)$_3$ (60%:30%:10%) 30 nm | ETM1 10 nm | ETM1:ETM2 (50%:50%) 35 nm |
| D-Ir200 comp. | HTM 30 nm | — | M7:M8:Ir200 (60%:30%:10%) 30 nm | ETM1 10 nm | ETM1:ETM2 (50%:50%) 35 nm |

TABLE 1-continued

Structure of the OLEDs

| Ex. | HTL2 thickness | EBL thickness | EML thickness | HBL thickness | ETL thickness |
|---|---|---|---|---|---|
| D-Ir(L5)$_3$ | HTM 30 nm | — | M7:M8:Ir(L5)$_3$ (60%:30%:10%) 30 nm | ETM1 10 nm | ETM1:ETM2 (50%:50%) 35 nm |
| D-Ir(L6)$_3$ | HTM 30 nm | — | M7:M8:Ir(L6)$_3$ (60%:30%:10%) 30 nm | ETM1 10 nm | ETM1:ETM2 (50%:50%) 35 nm |
| D-Ir(L9)$_3$ | HTM 30 nm | — | M7:M8:Ir(L9)$_3$ (60%:30%:10%) 30 nm | ETM1 10 nm | ETM1:ETM2 (50%:50%) 35 nm |
| D-Ir203 | HTM 30 nm | — | M7:M8:Ir203 (60%:30%:10%) 30 nm | ETM1 10 nm | ETM1:ETM2 (50%:50%) 35 nm |
| D-Ir205 | HTM 30% | — | M7:M8:Ir205 (60%:30%:10%) 30 nm | ETM1 10 nm | ETM1:ETM2 (50%:50%) 35 nm |
| D-Ir206 | HTM 30 nm | — | M7:M8:Ir206 (40%:50%:10%) 30 nm | ETM1 10 nm | ETM1:ETM2 (50%:50%) 35 nm |
| D-Ir211 | HTM 30 nm | — | M7:M8:Ir211 (60%:30%:10%) 30 nm | ETM1 10 nm | ETM1:ETM2 (50%:50%) 35 nm |
| D-Ir400 | HTM 30 nm | — | M7:M8:Ir400 (60%:30%:10%) 30 nm | ETM1 10 nm | ETM1:ETM2 (50%:50%) 35 nm |
| D-Pt100 | HTM 30 nm | — | M7:M8:Pt100 (40%:50%:10%) 30 nm | ETM1 10 nm | ETM1:ETM2 (50%:50%) 35 nm |
| Blue OLEDs | | | | | |
| D-Ir(L14)$_3$ | HTM 30 nm | EBM 10 nm | M1:M4:Ir(L14)$_3$ (60%:35%:5%) 25% | HBM 10 nm | ETM1:ETM2 (50%:50%) 15 nm |
| D-Ir218 | HTM 30 nm | EBM 10 nm | M1:M4:Ir218 60/5 25% | HBM 10% | ETM1:ETM2 (50%:50%) 15 nm |

TABLE 2

Results for the vacuum-processed OLEDs

| Ex. | EQE (%) 1000 cd/m$^2$ | Voltage (V) 1000 cd/m$^2$ | CIE x/y 1000 cd/m$^2$ | LD80 (h) 1000 cd/m$^2$ |
|---|---|---|---|---|
| Red OLEDs | | | | |
| D-IrR1 | 16.8 | 2.8 | 0.65/0.35 | 14000 |
| D-Ir402 | 16.5 | 3.0 | 0.63/0.36 | 18000 |
| D-Ir404 | 17.2 | 2.9 | 0.64/0.36 | 21000 |
| Yellow OLEDs | | | | |
| D-IrY1 | 22.3 | 3.0 | 0.44/0.54 | 30000 |
| D-Ir(L11)$_3$ | 19.8 | 2.9 | 0.39/0.57 | 23000 |
| D-Ir204 | 23.4 | 2.9 | 0.46/0.53 | 43000 |
| D-Ir217 | 20.9 | 2.9 | 0.46/0.53 | 42000 |
| Green OLEDs | | | | |
| D-IrG1 | 18.0 | 3.4 | 0.32/0.64 | 9000 |
| D-IrG2 | 18.3 | 3.3 | 0.33/0.63 | 23000 |
| D-Ir(L1)$_3$ | 19.1 | 3.3 | 0.34/0.62 | 15000 |
| D-Ir(L2)$_3$ | 18.9 | 3.4 | 0.35/0.63 | 12000 |
| D-Ir200 | 19.2 | 3.3 | 0.34/0.62 | 11000 |
| D-Ir(L5)$_3$ | 20.3 | 3.3 | 0.32/0.64 | 29000 |
| D-Ir(L6)$_3$ | 20.7 | 3.3 | 0.32/0.65 | 35000 |
| D-Ir(L9)$_3$ | 20.5 | 3.5 | 0.33/0.64 | 27000 |
| D-Ir203 | 20.0 | 3.3 | 0.32/0.64 | 20000 |
| D-Ir205 | 20.1 | 3.2 | 0.33/0.63 | 28000 |
| D-Ir206 | 23.3 | 3.2 | 0.32/0.65 | 29000 |
| D-Ir211 | 22.2 | 3.3 | 0.32/0.64 | 33000 |
| D-Ir400 | 23.1 | 3.5 | 0.35/0.63 | 20000 |
| D-Pt100 | 19.1 | 3.6 | 0.31/0.62 | — |
| Blue OLEDs | | | | |
| D-Ir(L14)$_3$ | 21.7 | 4.8 | 0.16/0.30 | 1400 |
| D-Ir218 | 23.5% | 4.6 | 0.16/0.31 | 1600 |

2) Solution-Processed Devices Made from Soluble Functional Materials

The complexes of the invention may also be processed from solution and in that case lead to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/PEDOT (80 nm)/interlayer (80 nm)/emission layer (80 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in the cleanroom, as a buffer layer, an 80 nm layer of PEDOT (PEDOT is a polythiophene derivative (Baytron P VAI 40835p.) from H. C. Starck, Goslar, which is supplied as an aqueous dispersion) is applied by spin-coating. The required spin rate depends on the degree of dilution and the specific spin-coater geometry (typical value for 80 nm: 4500 rpm). In order to remove residual water from the layer, the substrates are baked on a hotplate at 180° C. for 10 minutes. The interlayer used serves for hole injection; in this case, HIL-012 from Merck is used. The interlayer may alternatively also be replaced by one or more layers which merely have to fulfil the condition of not being leached off again by the subsequent processing step of EML deposition from solution. For production of the emission layer, the emitters of the invention are dissolved together with the matrix materials in toluene. The typical solids content of such solutions is between 16 and 25 WI when, as here, the layer thickness of 80 nm which is typical of a device is to be achieved by means of spin-coating. The type 1 solution-processed devices contain an emission layer composed of (polystyrene):M5:M6:Ir(L)$_3$ (20%:30%:40%: 10%); the type 2 devices contain an emission layer composed of (polystyrene):M5:M6:Ir(L204)$_3$:Ir(L)$_3$ (20%:20%: 40%:15%:5%). The emission layer is spun on in an inert gas atmosphere, argon in the present case, and baked at 130° C. for 30 min. Lastly, a cathode composed of barium (5 nm) and then aluminium (100 nm) (high-purity metals from Aldrich, particularly barium 99.99% (cat. no. 474711); vapour deposition systems from Lesker or the like, typical vapour deposition pressure 5×10$^{-6}$ mbar) is applied by vapour deposition. It is optionally possible first to apply a hole blocker layer and then an electron transport layer and only then the cathode (e.g. Al or LiF/Al) by vapour deposition under reduced pressure. In order to protect the device from air and air humidity, the device is finally encapsulated and then characterized. The OLED examples cited are yet to be optimized; Table 3 summarizes the data obtained.

Table 3: Results with Materials Processed from Solution

TABLE 3

Results with materials processed from solution

| Ex. | Emitter Device | EQE (%) Efficiency at 1000 cd/m$^2$ | Voltage (V) 1000 cd/m$^2$ | CIE x/y 1000 cd/m$^2$ |
|---|---|---|---|---|
| Red OLEDs ||||| 
| D-Sol001 | Ir405 Type 2 | 16.3 | 4.0 | 0.64/0.36 |
| Green OLEDs |||||
| D-Sol100 | Ir207 Type 1 | 20.3 | 5.1 | 0.59/0.39 |
| D-Sol-101 | Ir211 Type 1 | 20.7 | 5.3 | 0.62/0.34 |

TABLE 4

Structural formulae of the materials used

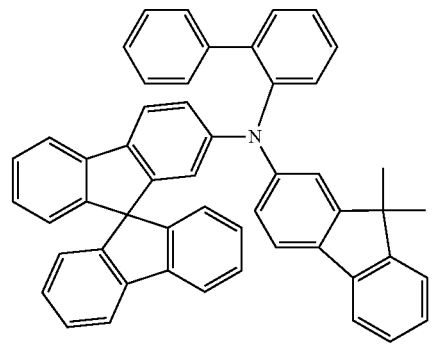

HTM

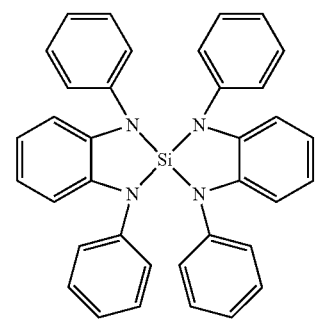

EBM = M10

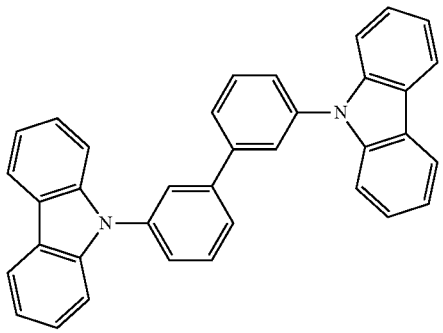

M1

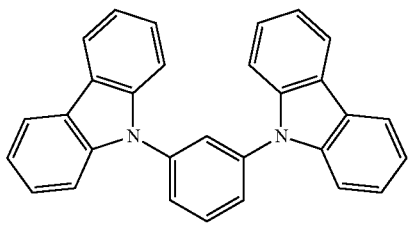

M2

TABLE 4-continued
Structural formulae of the materials used
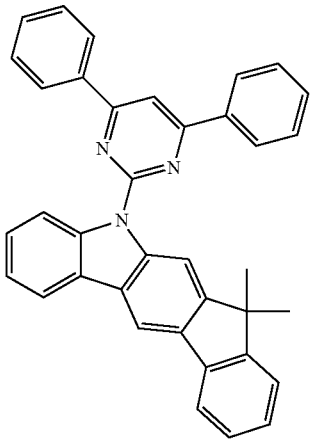
M3 = HBM2
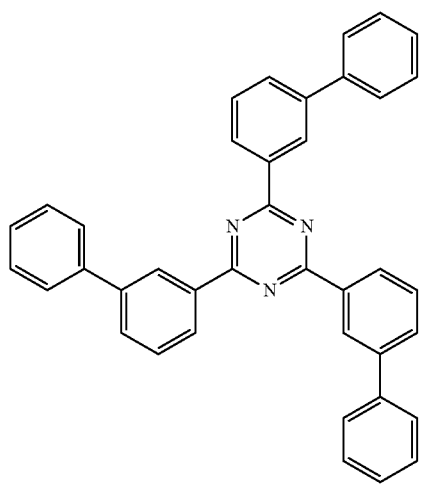
M4 = HBM1
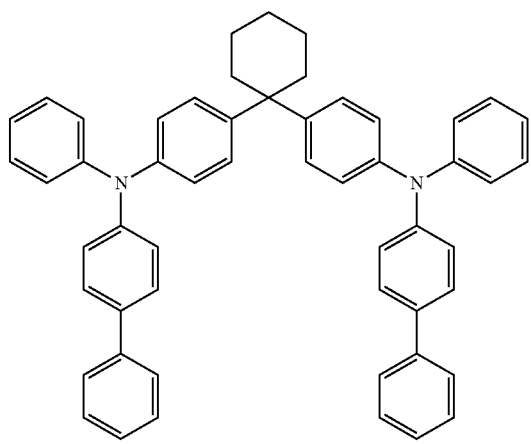
M5
TABLE 4-continued
Structural formulae of the materials used
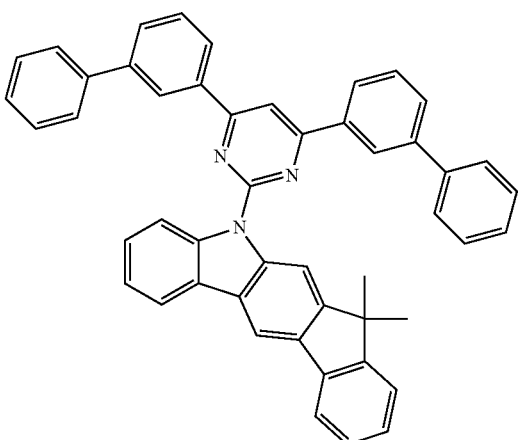
M6
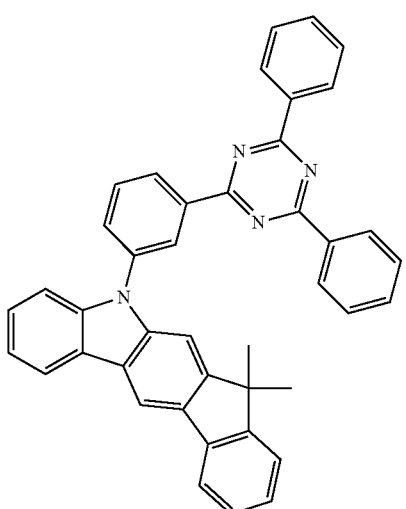
M7
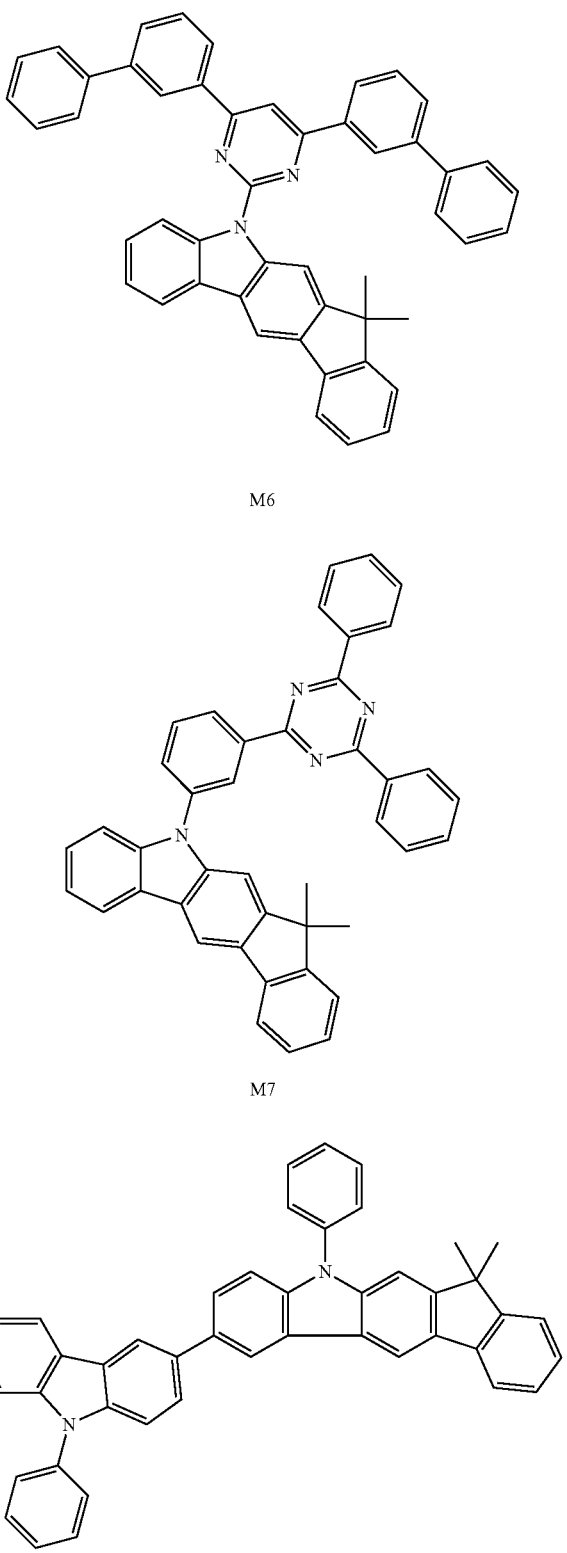
M8

TABLE 4-continued
Structural formulae of the materials used
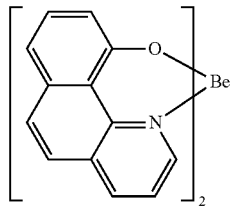
148896-39-3
M9
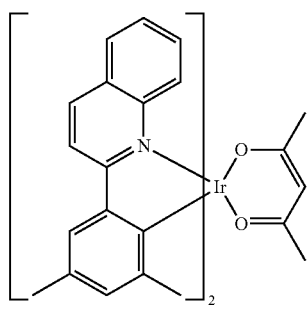
1056874-46-4
IrR1
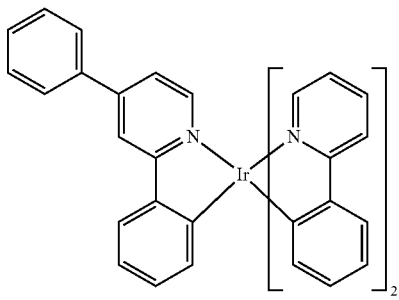
1215281-24-5
IrY1
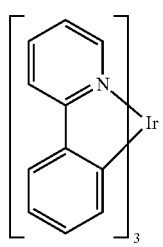
693794-98-98
IrG1
TABLE 4-continued
Structural formulae of the materials used
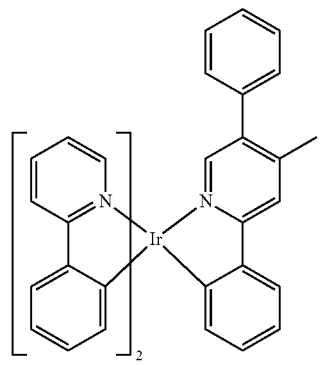
1215692-34-4
IrG2
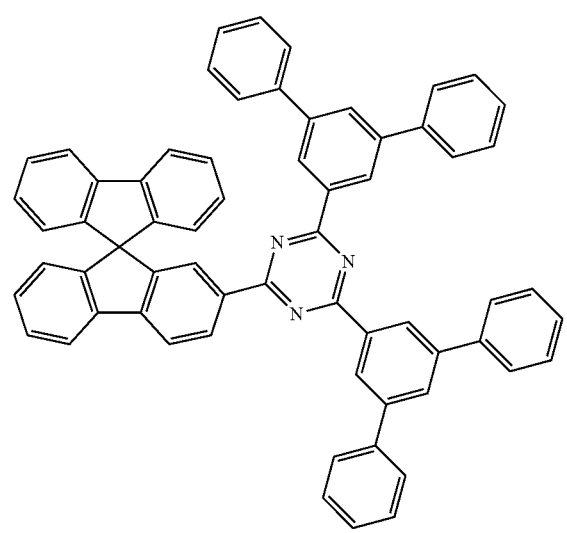
ETM1
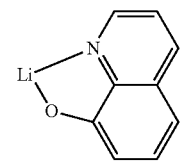
ETM2
The invention claimed is:
1. A compound of formula (1):
$$M(L)_n(L')_m \qquad (1)$$
comprising a substructure $M(L)_n$ of formula (2):
Formula (2)
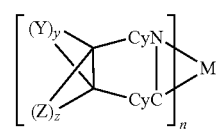

wherein

M is iridium or platinum;

CyC is a structure of formula (CyC-1):

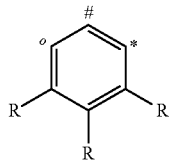
(CyC-1)

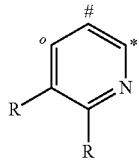
(CyC-2)

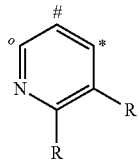
(CyC-3)

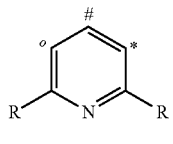
(CyC-4)

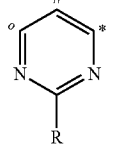
(CyC-5)

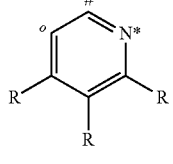
(CyN-1)

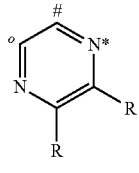
(CyN-2)

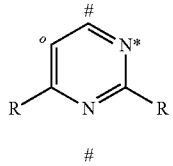
(CyN-3)

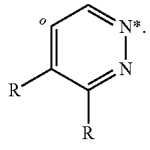
(CyN-4)

wherein CyC-1 binds to CyN at the position identified by # and coordinates to M at the position identified by * and the bicyclic group containing Y and Z is bonded at the position identified by o;

CyN is a structure of formula (CyN):

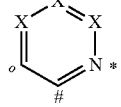
(CyN)

wherein the CyN binds to CyC at the position identified by # and coordinates to M at the position identified by * and the bicyclic group containing Y and Z is bonded at the position identified by o;

X is the same or different in each instance and is CR or N, with the proviso that not more than two X in CyC and not more than two X in CyN are N;

Y is the same or different in each instance and is $CR_2$;

Z is the same or different in each instance and is $CR_2$;

R is the same or different in each instance and is H, D, F, Cl, Br, I, $N(R^1)_2$, CN, $NO_2$, OH, $COOR^1$, $C(=O)N(R^1)_2$, $Si(R^1)_3$, $B(OR^1)_2$, $C(=O)R'$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms, an alkenyl or alkynyl group having 2 to 20 carbon atoms, or a branched or cyclic alkyl, alkoxy, or thioalkoxy group having 3 to 20 carbon atoms, each of which is optionally substituted by one or more $R^1$ radicals, wherein one or more nonadjacent $CH_2$ groups are optionally replaced by $R^1C=CR^1$, $R^1C=N$, $Si(R^1)_2$, $C=O$, $NR^1$, O, S, or $CONR^1$ and wherein one or more hydrogen atoms are optionally replaced by D, F, Cl, Br, I, or CN, an aromatic or heteroaromatic ring system having 5 to 40 aromatic ring atoms and is optionally substituted in each case by one or more $R^1$ radicals, an aryloxy or heteroaryloxy group having 5 to 40 aromatic ring atoms and is optionally substituted by one or more $R^1$ radicals, an aralkyl or heteroaralkyl group having 5 to 40 aromatic ring atoms and is optionally substituted by one or more $R^1$ radicals, or a diarylamino group, diheteroarylamino group, or arylheteroarylamino group having 10 to 40 aromatic ring atoms and is optionally substituted by one or more $R^1$ radicals; and wherein two adjacent R radicals together optionally define a mono- or polycyclic, aliphatic, aromatic, or heteroaromatic ring system;

$R^1$ is the same or different in each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms, an alkenyl or alkynyl group having 2 to 20 carbon atoms, or a branched or cyclic alkyl, alkoxy, or thioalkoxy group having 3 to 20 carbon atoms, each of which is optionally substituted by one or more $R^2$ radicals, wherein one or more nonadjacent $CH_2$ groups is optionally replaced by $R^2C=CR^2$, $R^2C=N$, $Si(R^2)_2$, $C=O$, $NR^2$, O, S, or $CONR^2$ and wherein one or more hydrogen atoms is optionally replaced by D, F, Cl, Br, I, CN, or $NO_2$, an aromatic or heteroaromatic ring system having 5 to 40 aromatic ring atoms and is optionally substituted in each case by one or more $R^2$ radicals, an aryloxy or heteroaryloxy group having 5 to 40 aromatic ring atoms and is optionally substituted by one or more $R^2$ radicals, an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals; and wherein two or more adjacent $R^1$ radicals together optionally define a mono- or polycyclic, aliphatic, aromatic, or heteroaromatic ring system;

$R^2$ is the same or different in each instance and is H, D, F, or an aliphatic, aromatic, and/or heteroaromatic organic radical having 1 to 20 carbon atoms, wherein one or more hydrogen atoms are optionally replaced by F; and wherein two or more $R^2$ substituents together optionally define a mono- or polycyclic ring system;

L' is the same or different in each instance and is a ligand;

y is in each instance 3;

z is in each instance 3;

n is 1, 2, or 3;

m is 0, 1, 2, 3, or 4; and wherein two or more ligands L are optionally joined together or L is optionally joined to L' by a single bond or a bivalent or trivalent bridge so as to form a tridentate, tetradentate, pentadentate, or hexadentate ligand system; and R optionally is coordinated to M.

2. The compound of claim 1, wherein CyN is selected from the group consisting of structures of formulae (CyN-1) through (CyN-4):

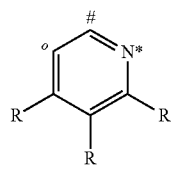
(CyN-1)

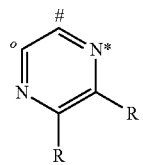
(CyN-2)

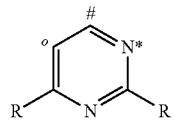
(CyN-3)

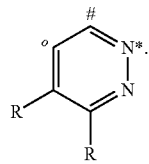
(CyN-4)

3. The compound of claim 1, wherein CyC is selected from the group consisting of structures of formulae (CyC-1a) through (CyC-1k) and CyN is selected from the group consisting of structures of formulae (CyN-1a) through (CyN-1c) and (CyN-2a)

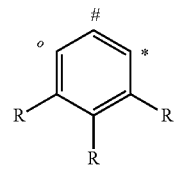
(CyC-1a)

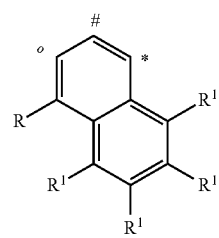
(CyC-1b)

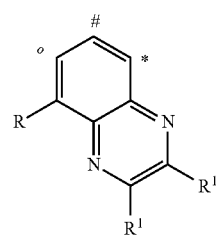
(CyC-1c)

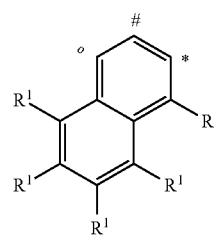
(CyC-1d)

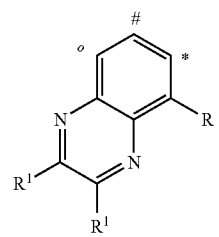
(CyC-1e)

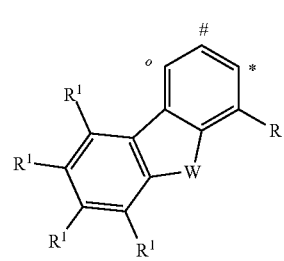
(CyC-1f)

-continued (CyC-1g)
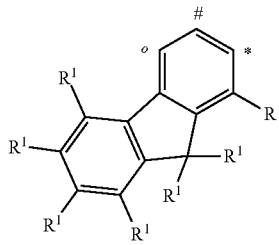

(CyC-1h)
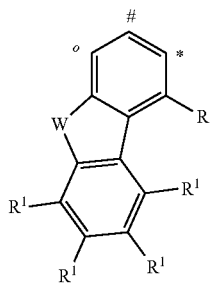

(CyC-1i)
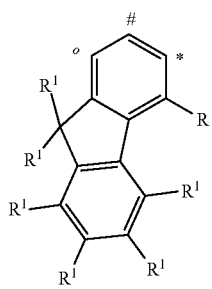

(CyC-1j)
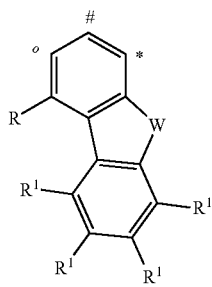

(CyC-1k)
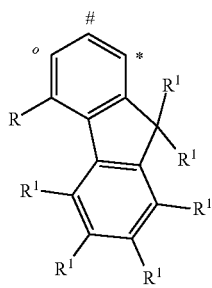

(CyN-1a)
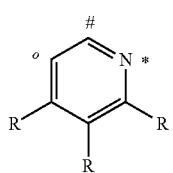

-continued (CyN-1b)
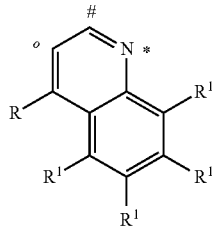

(CyN-1c)
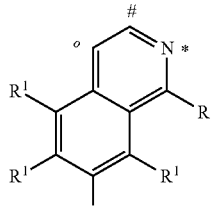

(CyN-2a)
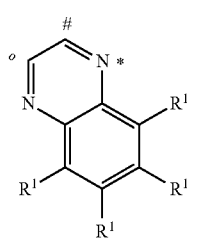

wherein R and R¹ do not form an aromatic or heteroaromatic ring system with one another and W is the same or different in each instance and is NR¹, O, or S.

4. The compound of claim 1, wherein the structure of formula (2) is a structure of formula (2a):

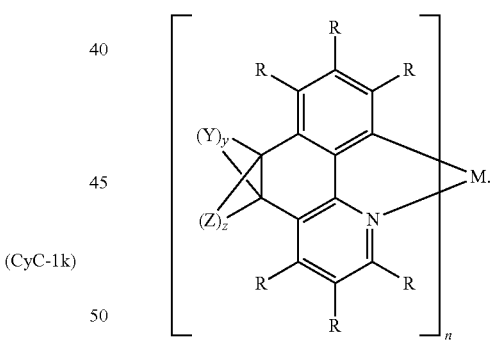

5. The compound of claim 1, wherein R, which, when X is CR, is bonded to the corresponding carbon atom, is the same or different in each instance and is selected from the group consisting of H, D, F, Br, I, N(R¹)₂, CN, Si(R¹)₃, B(OR¹)₂, C(=O)R¹, a straight-chain alkyl group having 1 to 10 carbon atoms, an alkenyl having 2 to 10 carbon atoms, or a branched or cyclic alkyl group having 3 to 10 carbon atoms, each of which is optionally substituted by one or more R¹ radicals, and wherein one or more hydrogen atoms are optionally replaced by D or F, or an aromatic or heteroaromatic ring system having 5 to 24 aromatic ring atoms and is optionally substituted in each case by one or more R¹ radicals; and wherein two R radicals together or an R radical together with an R¹ radical optionally define a ring system and wherein R, which, when Y and/or Z is CR₂, is bonded to the corresponding carbon atom, is the same or different in each instance and is selected from the group consisting of H, D, F, a straight-chain alkyl group having 1 to 10 carbon atoms and is optionally substituted by one or more $R^1$ radicals, a branched or cyclic alkyl group having 3 to 10 carbon atoms and is optionally substituted by one or more $R^1$ radicals, or an aromatic or heteroaromatic ring system having 6 to 13 aromatic ring atoms and is optionally substituted in each case by one or more $R^1$ radicals; and wherein two or more R radicals together optionally define a ring system.

6. The compound of claim 1, wherein L' is a bidentate monoanionic ligand.

7. The compound of claim 6, wherein L' is selected from the group consisting of 1,3-diketonates derived from 1,3-diketones, 3-ketonates derived from 3-keto esters, carboxylates derived from aminocarboxylic acids, and ligands which have, with M, a cyclometallated five-membered ring or six-membered ring having at least one metal-carbon bond.

8. A process for preparing a compound of claim 1 comprising reacting a free ligands L and optionally L' with a metal alkoxide of formula (58), a metal ketoketonate of formula (59), a metal halide of formula (60), a dimeric metal complex of formula (61), a metal complex of formula (62), or a metal compound bearing both alkoxide and/or halide and/or hydroxyl radicals and ketoketonate radicals:

Formula (58)

Formula (59)

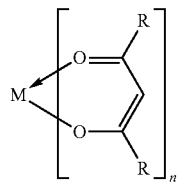

Formula (60)

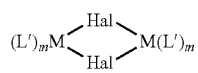

Formula (61)

Formula (62)

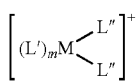

wherein

Hal is F, Cl, Br or I;

L" is an alcohol or a nitrile; and (Anion)

is a non-coordinating anion.

9. An oligomer, polymer, or dendrimer comprising a compound of claim 1, wherein one or more bonds of the compound to the polymer, oligomer, or dendrimer are present.

10. A formulation comprising a compound of claim 1 and at least one further compound.

11. A formulation comprising an oligomer, polymer or dendrimer of claim 9 and at least one further compound.

12. A compound of formula (63')

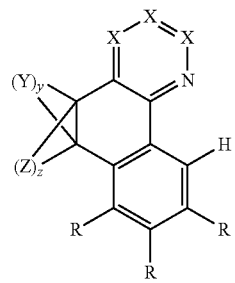

wherein

X is the same or different in each instance and is CR or N, with the proviso that not more than two X are N;

Y is the same or different in each instance and is CR₂;

Z is the same or different in each instance and is CR₂;

y is in each instance 3; and z is in each instance 3;

R is the same or different in each instance and is H, D, F, Cl, Br, I, N(R¹)₂, CN, NO₂, OH, COOR¹, C(=O)N(R¹)₂, Si(R¹)₃, B(OR¹)₂, C(=O)R¹, P(=O)(R¹)₂, S(=O)R¹, S(=O)₂R¹, OSO₂R¹, a straight-chain alkyl, alkoxy, or thioalkoxy group having 1 to 20 carbon atoms, an alkenyl or alkynyl group having 2 to 20 carbon atoms, or a branched or cyclic alkyl, alkoxy, or thioalkoxy group having 3 to 20 carbon atoms, each of which is optionally substituted by one or more R¹ radicals, wherein one or more nonadjacent CH₂ groups are optionally replaced by R¹C=CR¹, R¹C=N, Si(R¹)₂, C=O, NR¹, O, S, or CONR¹ and wherein one or more hydrogen atoms are optionally replaced by D, F, Cl, Br, I, or CN, an aromatic or heteroaromatic ring system having 5 to 40 aromatic ring atoms and is optionally substituted in each case by one or more R¹ radicals, an aryloxy or heteroaryloxy group having 5 to 40 aromatic ring atoms and is optionally substituted by one or more R¹ radicals, an aralkyl or heteroaralkyl group having 5 to 40 aromatic ring atoms and is optionally substituted by one or more R¹ radicals, or a diarylamino group, diheteroarylamino group, or arylheteroarylamino group having 10 to 40 aromatic ring atoms and is optionally substituted by one or more R¹ radicals; and wherein two adjacent R radicals together optionally define a mono- or polycyclic, aliphatic, aromatic, or heteroaromatic ring system;

R¹ is the same or different at each instance and is H, D, F, Cl, Br, I, N(R²)₂, CN, NO₂, Si(R²)₃, B(OR²)₂, C(=O)R², P(=O)(R²)₂, S(=O)R², S(=O)₂R², OSO₂R², a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which may be substituted by one or more R² radicals, where one or more nonadjacent CH₂ groups may be replaced by R²C=CR², R²C=N, Si(R²)₂, C=O, NR², O, S or CONR² and where one or more hydrogen atoms may be replaced by D, F, Cl, Br, I, CN or NO₂, or an aromatic or heteroaromatic ring system which has 5 to 40 aromatic ring atoms and may be substituted in each case by one or more R² radicals, or an aryloxy or heteroaryloxy group which has 5 to 40 aromatic ring atoms and may be substituted by one or more R² radicals, or an aralkyl or heteroaralkyl group which has 5 to 40 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals; at the same time, two or more adjacent $R^1$ radicals together may form a mono- or polycyclic, aliphatic, aromatic or heteroaromatic ring system;

$R^2$ is the same or different at each instance and is H, D, F or an aliphatic, aromatic and/or heteroaromatic organic radical having 1 to 20 carbon atoms, in which one or more hydrogen atoms may also be replaced by F; at the same time, two or more $R^2$ substituents together may also form a mono- or polycyclic ring system.

13. An electronic device comprising a compound of claim 1.

14. The electronic device of claim 13, wherein the electronic device is an organic electroluminescent device comprising one or more emitting layers, wherein the compound is present in the one or more emitting layers as an emitting compound.

15. An electronic device comprising an oligomer, polymer, or dendrimer of claim 9.

16. The electronic device of claim 15, wherein the electronic device is an organic electroluminescent device comprising one or more emitting layers, wherein the oligomer, polymer, or dendrimer is present in the one or more emitting layers as an emitting compound.

* * * * *

UNITED STATES PATENT AND TRADEMARK OFFICE
CERTIFICATE OF CORRECTION

| | |
|---|---|
| PATENT NO. | : 11,404,649 B2 |
| APPLICATION NO. | : 15/748472 |
| DATED | : August 2, 2022 |
| INVENTOR(S) | : Philipp Stoessel and Christian Ehrenreich |

It is certified that error appears in the above-identified patent and that said Letters Patent is hereby corrected as shown below:

In the Claims

Claim 1 at Column 86, Line 54 - Column 89, Line 29, should read as follows:
-- A compound of formula (1):

$$M(L)_n(L')_m \quad (1)$$

comprising a substructure $M(L)_n$ of formula (2):

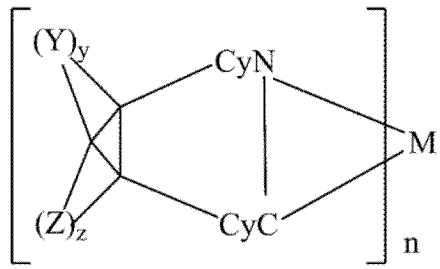

Formula (2)

wherein
  M is iridium or platinum;
  CyC is a structure of formula (CyC-1):

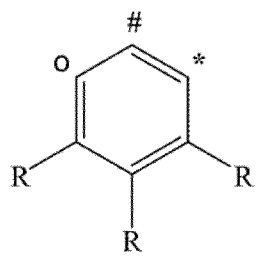

(CyC-1)

Signed and Sealed this
Seventh Day of January, 2025

Derrick Brent
*Acting Director of the United States Patent and Trademark Office* wherein CyC-1 binds to CyN at the position identified by # and coordinates to M at the position identified by * and the bicyclic group containing Y and Z is bonded at the position identified by o;

CyN is a structure of formula (CyN):

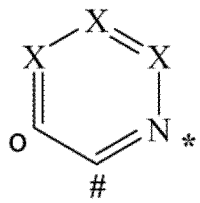

(CyN)

wherein the CyN binds to CyC at the position identified by # and coordinates to M at the position identified by * and the bicyclic group containing Y and Z is bonded at the position identified by o;

X is the same or different in each instance and is CR or N, with the proviso that not more than two X in CyC and not more than two X in CyN are N;

Y is the same or different in each instance and is $CR_2$;

Z is the same or different in each instance and is $CR_2$;

R is the same or different in each instance and is H, D, F, Cl, Br, I, $N(R^1)_2$, CN, $NO_2$, OH, $COOR^1$, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms, an alkenyl or alkynyl group having 2 to 20 carbon atoms, or a branched or cyclic alkyl, alkoxy, or thioalkoxy group having 3 to 20 carbon atoms, each of which is optionally substituted by one or more $R^1$ radicals, wherein one or more nonadjacent $CH_2$ groups are optionally replaced by $R^1C=CR^1$, $R^1C=N$, C≡C, $Si(R^1)_2$, C=O, $NR^1$, O, S, or $CONR^1$ and wherein one or more hydrogen atoms are optionally replaced by D, F, Cl, Br, I, or CN, an aromatic or heteroaromatic ring system having 5 to 40 aromatic ring atoms and is optionally substituted in each case by one or more $R^1$ radicals, an aryloxy or heteroaryloxy group having 5 to 40 aromatic ring atoms and is optionally substituted by one or more $R^1$ radicals, an aralkyl or heteroaralkyl group having 5 to 40 aromatic ring atoms and is optionally substituted by one or more $R^1$ radicals, or a diarylamino group, diheteroarylamino group, or arylheteroarylamino group having 10 to 40 aromatic ring atoms and is optionally substituted by one or more $R^1$ radicals;

and wherein two adjacent R radicals together optionally define a mono- or polycyclic, aliphatic, aromatic, or heteroaromatic ring system;

$R^1$ is the same or different in each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms, an alkenyl or alkynyl group having 2 to 20 carbon atoms, or a branched or cyclic alkyl, alkoxy, or thioalkoxy group having 3 to 20 carbon atoms, each of which is optionally substituted by one or more $R^2$ radicals, wherein one or more nonadjacent $CH_2$ groups is optionally replaced by $R^2C=CR^2$, $R^2C=N$, $C\equiv C$, $Si(R^2)_2$, $C=O$, $NR^2$, O, S, or $CONR^2$ and wherein one or more hydrogen atoms is optionally replaced by D, F, Cl, Br, I, CN, or $NO_2$, an aromatic or heteroaromatic ring system having 5 to 40 aromatic ring atoms and is optionally substituted in each case by one or more $R^2$ radicals, an aryloxy or heteroaryloxy group having 5 to 40 aromatic ring atoms and is optionally substituted by one or more $R^2$ radicals, an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals;

and wherein two or more adjacent $R^1$ radicals together optionally define a mono- or polycyclic, aliphatic, aromatic, or heteroaromatic ring system;

$R^2$ is the same or different in each instance and is H, D, F, or an aliphatic, aromatic, and/or heteroaromatic organic radical having 1 to 20 carbon atoms, wherein one or more hydrogen atoms are optionally replaced by F; and wherein two or more $R^2$ substituents together optionally define a mono- or polycyclic ring system;

L' is the same or different in each instance and is a ligand;
y is in each instance 3;
z is in each instance 3;
n is 1, 2, or 3;
m is 0, 1, 2, 3, or 4; and wherein
two or more ligands L are optionally joined together or L is optionally joined to L' by a single bond or a bivalent or trivalent bridge so as to form a tridentate, tetradentate, pentadentate, or hexadentate ligand system; and
R optionally is coordinated to M. --